United States Patent
Han

(10) Patent No.: US 12,106,984 B2
(45) Date of Patent: Oct. 1, 2024

(54) ACCELERATING PREVENTATIVE MAINTENANCE RECOVERY AND RECIPE OPTIMIZING USING MACHINE-LEARNING BASED ALGORITHM

(71) Applicant: Applied Materials, Inc., Santa Clara, CA (US)

(72) Inventor: Pengyu Han, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/534,446

(22) Filed: Nov. 23, 2021

(65) Prior Publication Data

US 2023/0163002 A1    May 25, 2023

(51) Int. Cl.
*H01L 21/67* (2006.01)
*G05B 13/02* (2006.01)
*G05B 19/418* (2006.01)

(52) U.S. Cl.
CPC .... *H01L 21/67276* (2013.01); *G05B 13/0265* (2013.01); *G05B 19/41875* (2013.01); *G05B 2219/32368* (2013.01)

(58) Field of Classification Search
CPC ........ H01L 21/67276; H01L 21/67253; G05B 13/0265; G05B 19/41875; G05B 2219/32368
See application file for complete search history.

(56) References Cited

U.S. PATENT DOCUMENTS

| | | | |
|---|---|---|---|
| 2017/0322877 A1* | 11/2017 | Chan | G06F 11/36 |
| 2018/0040460 A1* | 2/2018 | Gottscho | H01J 37/3299 |
| 2018/0082826 A1 | 3/2018 | Guha | |
| 2020/0333774 A1 | 10/2020 | Banna | |

(Continued)

FOREIGN PATENT DOCUMENTS

| | | |
|---|---|---|
| WO | 2021030833 A1 | 2/2021 |
| WO | 2021061541 A1 | 4/2021 |
| WO | 2021231544 A1 | 11/2021 |

OTHER PUBLICATIONS

International Search Report and Written Opinion for International application No. PCT/US2022/050484 dated Mar. 22, 2023, 10 pages.

*Primary Examiner* — Christopher E. Everett
(74) *Attorney, Agent, or Firm* — Lowenstein Sandler LLP

(57) ABSTRACT

A method for determining processing chamber conditions using sensor data and a machine learning model is provided. The method includes receiving, by a processing device, sensor data that include chamber data indicating a state of an environment of a processing chamber processing a substrate according to a set of process parameters of a current process. The sensor data further include spectral data indicating optical emission spectra (OES) measurements of a plasma disposed within the processing chamber. The method further includes using the sensor data as input to a machine learning model and obtaining one or more outputs that indicate one or more chamber condition metrics. The method further includes determining a recovery status of a processing chamber based on the one or more chamber condition metrics. The method further includes causing a modification to a performance of the processing chamber based on the recovery status of the processing chamber.

13 Claims, 10 Drawing Sheets

(56) References Cited

U.S. PATENT DOCUMENTS

2020/0337235 A1* 10/2020 Blank ................. A01M 21/043
2021/0166121 A1   6/2021 Tsutsui
2021/0358785 A1  11/2021 Merton
2022/0171373 A1   6/2022 Chau
2023/0049157 A1*  2/2023 Sawlani ............. G05B 13/0265

* cited by examiner

ACCELERATING PREVENTATIVE MAINTENANCE RECOVERY AND RECIPE OPTIMIZING USING MACHINE-LEARNING BASED ALGORITHM

TECHNICAL FIELD

Embodiments of the present disclosure relate, in general, to predicting chamber conditions of manufacturing systems. Specifically, the present disclosure relates to determining chamber conditions to identify chamber recover status and/or update parameters of a process.

BACKGROUND

Substrate processing may include a series of processes that produce electrical circuits in a semiconductor, e.g., a silicon wafer, in accordance with a circuit design. These processes may be carried out in a series of chambers. Successful operation of a modern semiconductor fabrication facility may aim to facilitate a steady stream of wafers to be moved from one chamber to another in the course of forming electrical circuits in the wafer. In the process of performing many substrate processes, conditions of processing chambers may be altered and may result processed substrate failing to meet desired conditions and outcomes.

One such substrate process may include plasma etching, which is a process of transferring a pattern in a layer of mask material into another layer under the mask, such as a layer of conductive or dielectric material, by removing the layered material from the wafer surface. Such a process inevitably generates different kinds of etch by-products, such as silicon oxide and organic polymer, depending on the layered material and the etch chemistry. Some of the by-products deposit onto interior surfaces of the chamber in which the plasma etching process is performed. The deposition of the by-products may affect etch performance such as by depositing particles (e.g., flakes) onto the substrate or by reacting with the plasma and affecting the process result.

To mitigate the impact of etch by-products, preventative maintenance such as chamber cleaning may be employed to periodically remove the deposition from the chamber wall. An example of preventative maintenance may include taking the chamber out of production and introducing a cleaning plasma, such as a $CF_4+O_2$ plasma for cleaning silicon oxide deposited during silicon etching, into the chamber. This plasma reacts with the deposited material and the products of this reaction are pumped out of the chamber. After such chamber cleaning, however, it has been observed that a clean chamber wall make the chamber unsuitable for immediate production wafer etching. Chamber seasoning is a procedure of etching a series of substrates (e.g., blank silicon wafers) to restore a chamber condition that is suitable for production substrate processing. After chamber seasoning, a thin layer of silicon oxide may cover the chamber wall. The chamber is then returned to production wafer etching until the next round of chamber cleaning and seasoning. Preventative maintenance may also include removing dirt and/or deposition by physical methods (e.g., wiping off one or more surfaces of the process chamber).

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an exemplary embodiment, a method includes a processing device receiving sensor data that includes chamber data indicating a state of an environment of a processing chamber processing a substrate according to a set of process parameters of a current process. The chamber data further includes spectral data indicating optical emission spectra (OES) measurement of plasma disposed within the process chamber. The processing chamber processes the substrate according to the set of process parameters of the current process. The method further includes using the sensor data as input to a machine learning model. The method further includes obtaining one or more outputs of the machine learning model. The one or more outputs indicate one or more chamber condition metrics. The method further includes determining a recovery status of the processing chamber based on the one or more chamber condition metrics, the recovery status associated with a chamber recovery process (e.g., chamber seasoning procedure) performed subsequent to a preventative maintenance procedure. The method further includes causing a modification to a performance of the processing chamber based on the recovery status of the processing chamber.

In an exemplary embodiment, a method for training a machine learning model to determine a status of a processing chamber in a chamber recovery procedure is provided. The processing chamber processes a current substrate according to a current process. The method includes generating training data for the machine learning model. Generating the training data includes identifying a first training input having historical sensor data including historical chamber data. The historical chamber data indicates a state of an environment of a second processing chamber processing a prior substrate according to a prior process. The sensor data further includes historical spectral data indicating optical emission spectra (OES) measurements of a prior plasma disposed within the second processing chamber processing the prior substrate according to the prior process. Generating the training data further includes identifying a first target output for the first training input. The first target output includes historical process result data having process result measurement of the prior substrate processed using the second processing chamber according to the prior process. The method further includes providing the training data to train the machine learning model on a set of training inputs comprising the first training input and a set of target outputs comprising the first target output.

In an exemplary embodiment, a non-transitory computer readable medium comprising instruction that, when executed by a processing device cause the processing device to perform actions. The performed actions include receiving sensor data that includes chamber data indicating a state of an environment of a processing chamber processing a substrate according to a set of process parameters of a current process. The chamber data further includes spectral data indicating optical emission spectra (OES) measurement of plasma disposed within the process chamber. The processing chamber processes the substrate according to the set of process parameters of the current process. The actions further include using the sensor data as input to a machine learning model. The method further includes obtaining one or more outputs of the machine learning model. The one or more outputs indicating one or more chamber conditions metrics. The actions further include determining a recovery status of the processing chamber based on the one or more chamber condition metrics, the recovery status associated with a chamber recovery process performed subsequent to a preventative maintenance procedure. The actions further include causing a modification to a performance of the processing chamber based on the recovery status of the processing chamber.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
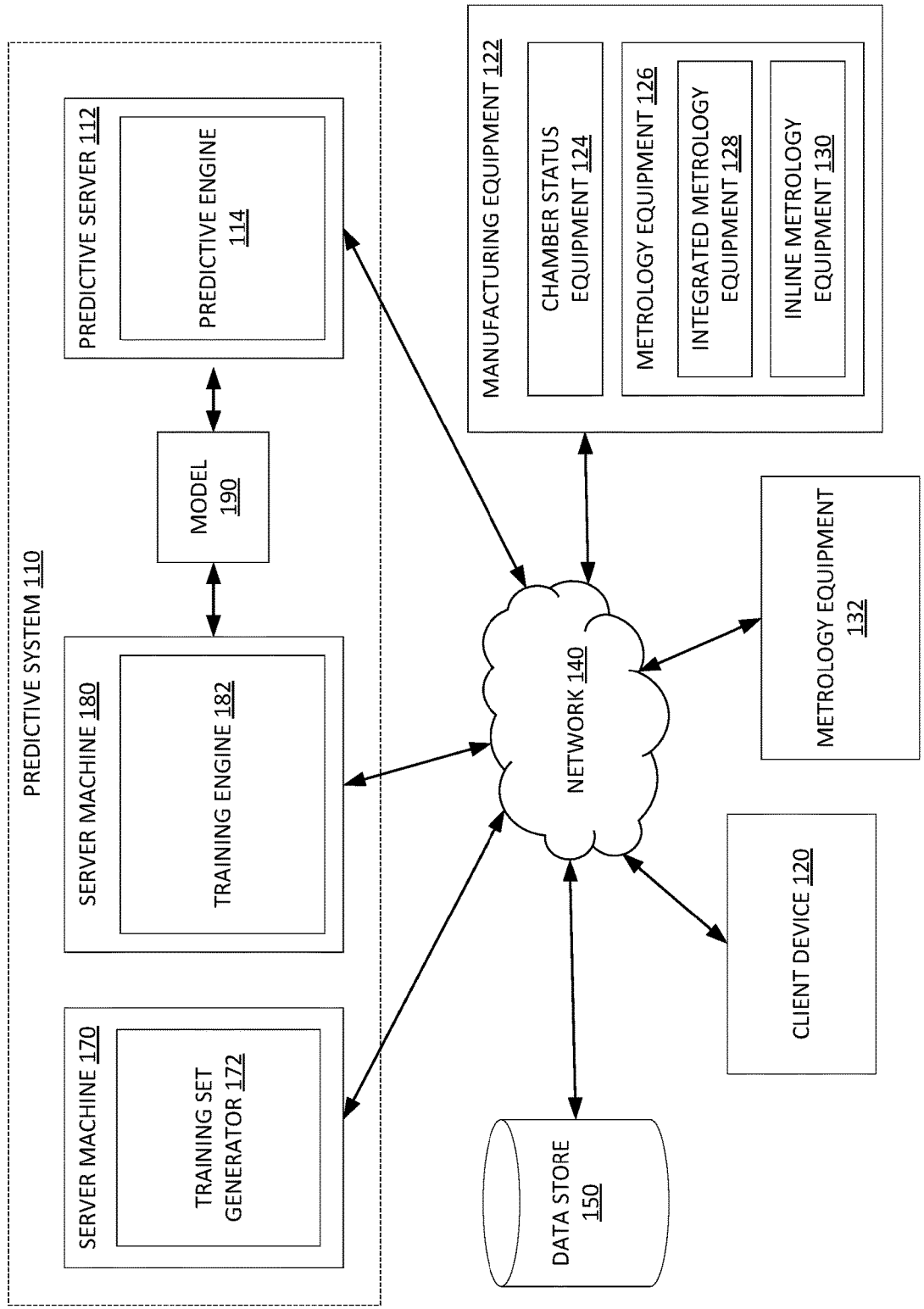
FIG. 1 depicts an illustrative system architecture, according to aspects of the present disclosure.

Embodiments of the present disclosure are directed to a spectral measurement system for enhanced spectral data collection and predicting chamber condition metrics using machine learning. Process results of manufacturing processes depend on many factors, one of which is a process recipe and/or one or more chamber parameter settings. Another often occurring factor is process shift resulting from Preventative Maintenance (PM) or other events, which causes process result changes even if recipes remain the same. A newly-serviced chamber (post-PM) or cold chamber often has a "first-wafer-effect" where process results of substrates processed using the newly-serviced or cold chamber deviate from process results of substrates processed by chambers that are not recently serviced. The effects of PM can be remedied by performing one or a few seasoning wafer runs to season the chamber to its 'normal' operation condition. In some cases and some applications, post-PM chambers take a few days/weeks to reach their desired 'normal' operation conditions.

Preventative maintenance procedures (e.g., chamber cleaning) are often used as part of a chamber recovery process to return a state of the processing chamber to a state suitable for entering a substrate processing production mode (e.g., mass processing of substrates). A recovery procedure is often used subsequent to a preventative maintenance procedure to prepare a chamber for a production mode (e.g., "warm up" the chamber). A common recovery procedure conventionally employed is seasoning a processing chamber. Chamber seasoning is a procedure that includes processing a series of substrates (e.g., blank silicon wafers) to restore a chamber condition (e.g., coating the walls of the chamber) that is suitable for a production substrate process (e.g., substrates processed in the chamber having process results that meet desired threshold criteria). After chamber seasoning, a chamber may operate in a production mode for a period of time until another round of preventative maintenance and further chamber seasoning is performed or otherwise recommended to restore a state of the processing chamber.

The penalty of 'abnormal' chamber conditions can include failure for a substrate process to produce a substrate meeting target process results (e.g., film depth, critical dimension on a wafer, side wall angle, etc.). For example, a process recipe may indicate a processing time and an "abnormal" condition would prevent the substrate from meeting a target process result in the indicated recipe time. Chamber abnormalities can cause process/etch result deviations from a target process result across a batch of substrates. For example, abnormal chamber conditions may cause a processed substrate to have an etch pattern that deviates from a target etch pattern. Failure to achieve a target etch pattern on the surface of the substrates can cause a yield decrease of the manufactured integrated circuit (IC) chips ultimately produced from the substrate.

Knowing the current chamber condition (e.g., chamber condition metrics) of a chamber can allow a fabrication system to adaptively revise process parameters to achieve target process results. However, there is difficulty in identifying chamber conditions. The difficulty is due in part to subtle differences in chamber parameters between 'normal' and 'abnormal' conditions. For example, there may be some differences in optical emission spectroscopy (OES) spectra after a chamber has recently undergone preventative maintenance (PM), however, predicting the effects of these subtle difference on process result remains complicated.

Conventionally, a series of substrates are processed within a processing chamber subsequent to a preventative maintenance procedure. Subsequent to processing the series of substrates a test sample is processed and evaluated. A test sample may include a substrate that is processed in the processing chamber and is evaluated (e.g., process results are measured) to determine whether the test sample contains process results meeting threshold conditions. If the condition(s) are not met further seasoning substrate may be processed and another test sample may be processed to determine whether a chamber is fully recovered. This process may be repeated until a chamber condition is met or a threshold quantity of seasoning wafers have been used. Conventional methods of determining chamber conditions, such as previously described, can require unnecessary quantities of seasoning wafers (e.g., "over-seasoning" a chamber) when a first quantity of seasoning wafer are used but a smaller number is actually required to recover a chamber into an operable state to carry out a substrate production. Additionally, conventional methods can necessitate delays in returning a chamber to a production mode by waiting for test sample measurements and evaluations needed to determine whether a chamber has sufficiently recovered. The time taking for the recovery procedures is a loss in productivity because a tool or chamber is down (e.g., not operating in a production mode). Furthermore, conventional methods do not provide for in-situ chamber condition monitoring but depend on test sample and awaiting test sample evaluations during a seasoning process.

Aspects and implementations of the present disclosure address these and other shortcomings of conventional technology by leveraging machine learning to identify chamber condition metrics associated with process results of substrates processed within a chamber. The application of Machine-learning and deep-learning provide a way to identify the unique features in data and build correlation models between data and chamber labels. Using a trained model, a processing chamber can provide in-situ spectral data that can be used for real time chamber condition prediction and control. This may be employed, for example, to achieve consistent process results even in the presence of diverse chamber conditions. The chamber conditions can be mapped to a status of a processing chamber on a chamber recovery process. For example, preventative maintenance may be performed on a chamber and a chamber may undergo a recovery process (e.g., a chamber seasoning procedure) to return the chamber to a consistent operational state. Different stages of the recovery process may result to different chamber conditions such that a chamber condition may be used to indicate which stage of the recovery process a processing chamber is currently operating under.

Aspects and implementations of the present disclosure address these and other shortcomings of the existing technology by providing methods and systems in various embodiments capable of estimating chamber conditions without depending on inspection results of test samples, providing quantitative information regarding chamber health and recovery subsequent to a preventive maintenance procedure, and enable simulation of chamber conditions with artificial parameter adjustments. In some embodiments, the present disclosure enables health check and precaution during a chamber seasoning sequence and early detection of abnormal chamber condition before a sample test. One of more of these aspects and/or implementations may result in reduced down time of processing tools (e.g., processing chambers) and can enable greater productivity of the manufacturing equipment. In addition, it may be possible to revise process parameters based on the ML model using chamber sensor or Optical Emission Spectroscopy (OES). The revisions of the process parameter may permit a chamber to return to production much faster without waiting for full seasoning and full verification of chamber status by metrology measurement.

Optical Emission Spectroscopy (OES), reflectometer spectra (e.g., endpoint detection interferometric (IEP)), and chamber sensor data (e.g., temperature, pressure, radio frequency (RF) power, plasma conditions, vacuum conditions, etc.) can be indicators of chamber conditions. Chamber conditions change after PM, when it is cold, and further after the chamber is seasoned. These changes cause process results (e.g., etch results) to vary even when the same recipe is used. The varying process results (e.g., yield, electrical measurement, metrology data, etc.) can be processed to identify proper labels for model training. Chamber condition labels (e.g., chamber condition metrics) with associated OES and chamber sensor data can be used as training data for a Machine-Learning model. In some embodiments, the machine-learning type may include a Neural Network, and/or may include logistic regression and multi-layer perceptron. After a model is trained, validated and tested, it may be applied in a prediction engine. The engine takes in-situ OES spectra and sensor data, and predicts chamber conditions. It can further revise/suggest optimum chamber parameters for current and/or future wafer processing.

The process results (e.g., process yield, electrical measurement, metrology data, etc.) for a substrate (e.g., from production lots) can be leveraged to examine model performance. When results are not satisfactory, chambers can be inspected, tested, and improved. Further training can be conducted when results are not satisfactory or when new chamber conditions are identified/found in new lots run (e.g., to accommodate more complete chamber conditions).

In an exemplary embodiment, a method includes a processing device receiving sensor data that includes chamber data indicating a state of an environment of a processing chamber processing a substrate according to a set of process parameters of a current process. The chamber data further includes spectral data indicating optical emission spectra (OES) measurement of plasma disposed within the process chamber. The processing chamber processes the substrate according to the set of process parameters of the current process. The method further includes using the sensor data as input to a machine learning model. The method further includes obtaining one or more outputs of the machine learning model. The one or more outputs indicating one or more chamber condition metrics. The method further includes determining a recovery status of the processing chamber based on the one or more chamber condition metrics, the recovery status associated with a chamber recovery process performed subsequent to a preventative maintenance procedure. The method further includes causing a modification to a performance of the processing chamber based on the recovery status of the processing chamber. For example, processing parameters for a current substrate or a future substrate may be processed or further processed according to the modification of the processing chamber.

In an exemplary embodiment, a method for training a machine learning model to determine a status of a processing chamber in a chamber recovery procedure is provided. The method includes generating training data for the machine learning model. Generating the training data includes identifying a first training input having historical sensor data including historical chamber data. The historical chamber data indicates a state of an environment of a second processing chamber processing a prior substrate according to a prior process. The sensor data further includes historical spectral data indicating optical emission spectra (OES) measurement of a prior plasma disposed within the second processing chamber processing the prior substrate according to the prior process. Generating the training data further includes identifying a first target output for the first training input. The first target output includes historical process result data having process result measurements of the prior substrate processed using the second processing chamber according to the prior process. The method further includes providing the training data to train the machine learning model on a set of training inputs comprising the first training input and a set of target outputs comprising the first target output.

In some embodiments the trained machine learning model is to receive a new input having new sensor data having new chamber data indicating a new state of a new environment of a new processing chamber processing a new substrate according to a new process and new spectral data indicating optical emission spectra (OES) measurements of a new plasma disposed within the new processing chamber processing the new substrate according to the new process to produce a new output based on the new input. The new output indicates a chamber condition metric corresponding to a recovery status associated with a chamber recovery process performed subsequent to a preventative maintenance procedure.

In an exemplary embodiment, a non-transitory computer readable medium comprises instruction that, when executed by a processing device, cause the processing device to perform actions. The performed actions include receiving sensor data that includes chamber data indicating a state of an environment of a processing chamber processing a substrate according to a set of process parameters of a current process. For example, the processing chamber may be processing one or more seasoning wafers as a part of a chamber recovery process. The chamber data further includes spectral data indicating optical emission spectra (OES) measurements of plasma disposed within the process chamber. The processing chamber processes the substrate according to the set of process parameters of the current process. The actions further include using the sensor data as input to a machine learning model. The method further includes obtaining one or more outputs of the machine learning model. The one or more outputs indicate one or more chamber condition metrics. The actions further include determining a recovery status of the processing chamber based on the one or more chamber condition metrics, where the recovery status is associated with a chamber recovery process (e.g., chamber seasoning procedure) performed subsequent to a preventative maintenance procedure. The actions further include causing a modification to a performance of the processing chamber based on the recovery status of the processing chamber. For example, the modification may be associated with a current substrate process such as processing a current substrate according to updated process parameters. Process parameters may include temperature, gas flow, gas pressure, electrical power, electrical bias, and so on. In another example, the modification may include halting a current substrate process. In another example, the modification may include a change to a process recipe used to process a future substrate.

FIG. 1 depicts an illustrative system architecture 100, according to aspects of the present disclosure. System architecture 100 includes a client device 120, manufacturing equipment 122, metrology equipment 132, a predictive server 112 (e.g., to generate predictive data, to provide model adaptation, to use a knowledge base, etc.), and a data store 150. The predictive server 112 can be part of a predictive system 110. The predictive system 110 can further include server machines 170 and 180. In some embodiments, system architecture 100 can include or be a part of a manufacturing system for processing substrates, such as manufacturing system 200 of FIG. 2. In additional or alternative embodiments, system architecture 100 can include or be a part of a chamber condition prediction system (e.g., determining a recovery status of a chamber from a PM procedure). Further details regarding the chamber condition prediction system are provided with respect to FIG. 3.

Components of the client device 120, manufacturing equipment 122, metrology equipment 132, predictive system 110, and/or data store 150 can be coupled to each other via a network 140. In some embodiments, network 140 is a public network that provides client device 120 with access to predictive server 112, data store 150, and other publicly available computing devices. In some embodiments, network 140 is a private network that provides client device 120 access to manufacturing equipment 122, metrology equipment 132, data store 150, and other privately available computing devices. Network 140 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 120 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc.

Manufacturing equipment 122 can produce products following a recipe or performing runs over a period of time. In some embodiments, manufacturing equipment 122 can include or be a part of a process tool that includes one or more stations (e.g., process chamber, transfer chamber, load lock, etc.) configured to perform a different function for a substrate. In some embodiments, manufacturing equipment 122 can further include chamber status equipment 124 that is configured to collect data to be used for determining chamber conditions (e.g., chamber condition metrics) of a processing chamber performing a process for a substrate at manufacturing equipment 122. A condition of a chamber may refer to a status of a processing chamber in a recovery process (e.g., chamber seasoning procedure) subsequent to a PM procedure being performed. Chamber status equipment 124 can include one or more components configured to collect and/or generate spectral data (e.g., OES or reflectometry spectra) associated with one or more portions of a profile of a surface of the substrate during a substrate process. Spectral data refers to data associated with an intensity (i.e., a strength or amount of energy) for a detected wave of energy for each wavelength of the detected wave.

In some embodiments, chamber status equipment 124 can include an optical fiber bundle and a collimator assembly that are configured to direct incident light from a light source to a surface of a substrate and transmit reflected light from the substrate surface to a light detection component. A processing device (e.g., a system controller for the process tool) coupled to chamber status equipment 124 can generate the spectral data for the substrate profile based on the reflected light transmitted to the light detection component and/or spectral data associated with an OES of the plasma emitted within the processing chamber. In other or similar embodiments, chamber status equipment 124 can include any sensors configured to generate spectral data associated with the substrate profile. Such sensors can include reflectometry sensors, ellipsometry sensors, thermal spectra sensors, capacitive sensors, and so forth. Further details regarding manufacturing equipment 122 and chamber status equipment 124 are described with regard to FIGS. 2 and 5, respectively.

In some embodiments, one or more stations of manufacturing equipment 122 can include sensors configured to generate and/or collect sensor data associated with manufacturing equipment 122. Sensor data can include a value of one or more of temperature (e.g., heater temperature), spacing (SP), pressure, high frequency radio frequency (HFRF), voltage of electrostatic chuck (ESC), electrical current, flow, power, voltage, etc. Sensor data can be associated with or indicative of manufacturing parameters such as hardware parameters, such as settings or components (e.g., size, type, etc.) of the manufacturing equipment 122, or process parameters of the manufacturing equipment 122. The sensor data can be provided while the manufacturing equipment 122 is performing a substrate process. The sensor data can be different for each substrate.

In some embodiments, manufacturing equipment 122 can include metrology equipment 126. Metrology equipment 126 can be configured to generate metrology data associated with substrates processed by manufacturing equipment 122. The metrology data can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate.

Metrology equipment 126 can be configured to generate metrology data associated with a substrate before or after a substrate process. Metrology equipment 126 can be integrated with a station of the process tool of manufacturing equipment 122. In some embodiments, metrology equipment 126 can be coupled to or be a part of a station of the process tool that is maintained under a vacuum environment (e.g., a process chamber, a transfer chamber, etc.). Such metrology equipment 126 is referred to as integrated metrology equipment 128. Accordingly, the substrate can be measured by the integrated metrology equipment 128 while the substrate is in the vacuum environment. For example, after a substrate process (e.g., an etch process, a deposition process, etc.) is performed for the substrate, the metrology data for the processed substrate can be generated by integrated metrology equipment 128 without the processed substrate being removed from the vacuum environment. In other or similar embodiments, metrology equipment 126 can be coupled to or be a part of the process tool station that is not maintained under a vacuum environment (e.g., a factory interface module, etc.). Such metrology equipment 126 is referred to as inline metrology equipment 130. Accordingly, the substrate is measured by inline metrology equipment 130 outside of the vacuum environment.

Additionally or alternatively to metrology equipment 126, system architecture 100 can include metrology equipment 132. Metrology equipment 132 can include metrology measurement devices that are separate (i.e., external) from manufacturing equipment 122. For example, metrology equipment 132 can be standalone equipment that is not coupled to any station of manufacturing equipment 122. For a measurement to be obtained for a substrate using metrology equipment 132, a user of a manufacturing system (e.g., an engineer, an operator) can cause a substrate processed at manufacturing equipment 122 to be removed from manufacturing equipment 122 and transferred to metrology equipment 132 for measurement. In some embodiments, metrology equipment 132 can transfer metrology data generated for the substrate to the client device 120 coupled to metrology equipment 132 via network 140 (e.g., for presentation to a manufacturing user, such as an operator or an engineer). In other or similar embodiments, the manufacturing system user can obtain metrology data for the substrate from metrology equipment 132 and can provide the metrology data to system architecture via a graphical user interface (GUI) of client device 120.

Data store 150 can be a memory (e.g., random access memory), a drive (e.g., a hard drive, a flash drive), a database system, or another type of component or device capable of storing data. Data store 150 can include multiple storage components (e.g., multiple drives or multiple databases) that can span multiple computing devices (e.g., multiple server computers). The data store 150 can store spectral data, non-spectral data (e.g., sensor data), metrology data, predictive data, and so forth. Spectral data can include historical spectral data (e.g., spectral data generated for a previous substrate processed at manufacturing equipment 122 or at other manufacturing equipment coupled to data store 150 via network 140) and/or current spectra (spectral data generated for a current substrate being processed at manufacturing equipment 122). Current spectral data can be data for which predictive data is generated. In some embodiments, metrology data can include historical metrology data (e.g., metrology measurement values for a prior substrate processed at the manufacturing equipment 122 or at other manufacturing equipment). The data store 150 can also store contextual data associated with a substrate being processed at the manufacturing system (e.g., recipe name, recipe step number, preventive maintenance indicator, operator, etc.).

One or more portions of data store 150 can be configured to store data that is not accessible to a user of the manufacturing system. In some embodiments, all data stored at data store 150 can be inaccessible by the manufacturing system user. In other or similar embodiments, a portion of data stored at data store 150 is inaccessible by the user while another portion of data stored at data store 150 is accessible to the user. In some embodiments, inaccessible data stored at data store 150 is encrypted using an encryption mechanism that is unknown to the user (e.g., data is encrypted using a private encryption key). In other or similar embodiments, data store 150 can include multiple data stores where data that is inaccessible to the user is stored in a first data store and data that is accessible to the user is stored in a second data store.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190 or set of machine learning models 190. Some operations of training set generator 172 are described in detail below with respect to FIG. 4. In some embodiments, the training set generator 172 can partition the training data into a training set, a validating set, and a testing set.

Server machine 180 can include a training engine 182. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190 or a set of machine learning models 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. The machine learning model 190 can include a linear regression model, a partial least squares regression model, a Gaussian regression model, a random forest model, a support vector machine model, a neural network, a ridge regression model, and so forth.

Training engine 182 can also be capable of validating a trained machine learning model 190 using a corresponding set of features of a validation set from training set generator 172. In some embodiments, training engine 182 can assign a performance rating for each of a set of trained machine learning models 190. A performance rating can correspond to an accuracy of a respective trained model, a speed of the respective model, and/or an efficiency of the respective model. Training engine 182 can select a trained machine learning model 190 having a performance rating that satisfies a performance criterion to be used by predictive engine 114, in accordance with embodiments described herein. Further details regarding training engine 182 are provided with respect to FIG. 9.

Predictive server 112 includes a predictive engine 114 that is capable of providing spectral data for a portion of a current substrate being processed at manufacturing equipment 122 as input to trained machine learning model 190 and running trained model 190 on the input to obtain one or more outputs. In some embodiments, trained model 190 run by predictive engine 114 is selected by training engine 182 as having a performance rating that satisfies a performance criterion, as described above. As described further with respect to FIG. 8, in some embodiments, predictive engine 114 is also capable of extracting data from the output of the trained machine learning model 190 and using the confidence data to determine a condition (e.g., chamber condition metric) of the processing chamber of the manufacturing equipment 122.

Confidence data can include or indicate a level of confidence that a chamber condition metric corresponds to one or more properties of a processing chamber associated with current spectral data. In one example, the level of confidence is a real number between 0 and 1, where 0 indicates no confidence that the chamber condition metric corresponds to one or more properties of the processing chamber associated with the current spectral data and 1 indicates absolute confidence that the chamber condition metrics corresponds to one or more properties of the processing chamber associated with the current spectral data. In some embodiments, a chamber condition prediction system can use predictive system 110 to provide chamber condition metrics for a processing chamber processing a substrate at the manufacturing system 122 instead of using the inline metrology equipment 130, integrated metrology equipment 130, and/or external metrology equipment 132 to determine measured metrology values. The chamber condition prediction system can determine a status of the processing chamber associated with a recovery process (e.g., chamber seasoning) performed subsequent to a PM procedure (e.g., chamber cleaning), in accordance with embodiments provided herein.

It should be noted that in some other implementations, the functions of server machines 170 and 180, as well as predictive server 112, can be provided by a larger or smaller number of machines. For example, in some embodiments, server machines 170 and 180 can be integrated into a single machine, while in some other or similar embodiments, server machines 170 and 180, as well as predictive server 112, can be integrated into a single machine. In general, functions described in one implementation as being performed by server machine 170, server machine 180, and/or predictive server 112 can also be performed on client device 120. In addition, the functionality attributed to a particular component can be performed by different or multiple components operating together. Further details regarding the grouping of functions of server machines 170, 180, as well as predictive server 112 are provided with respect to FIG. 3.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
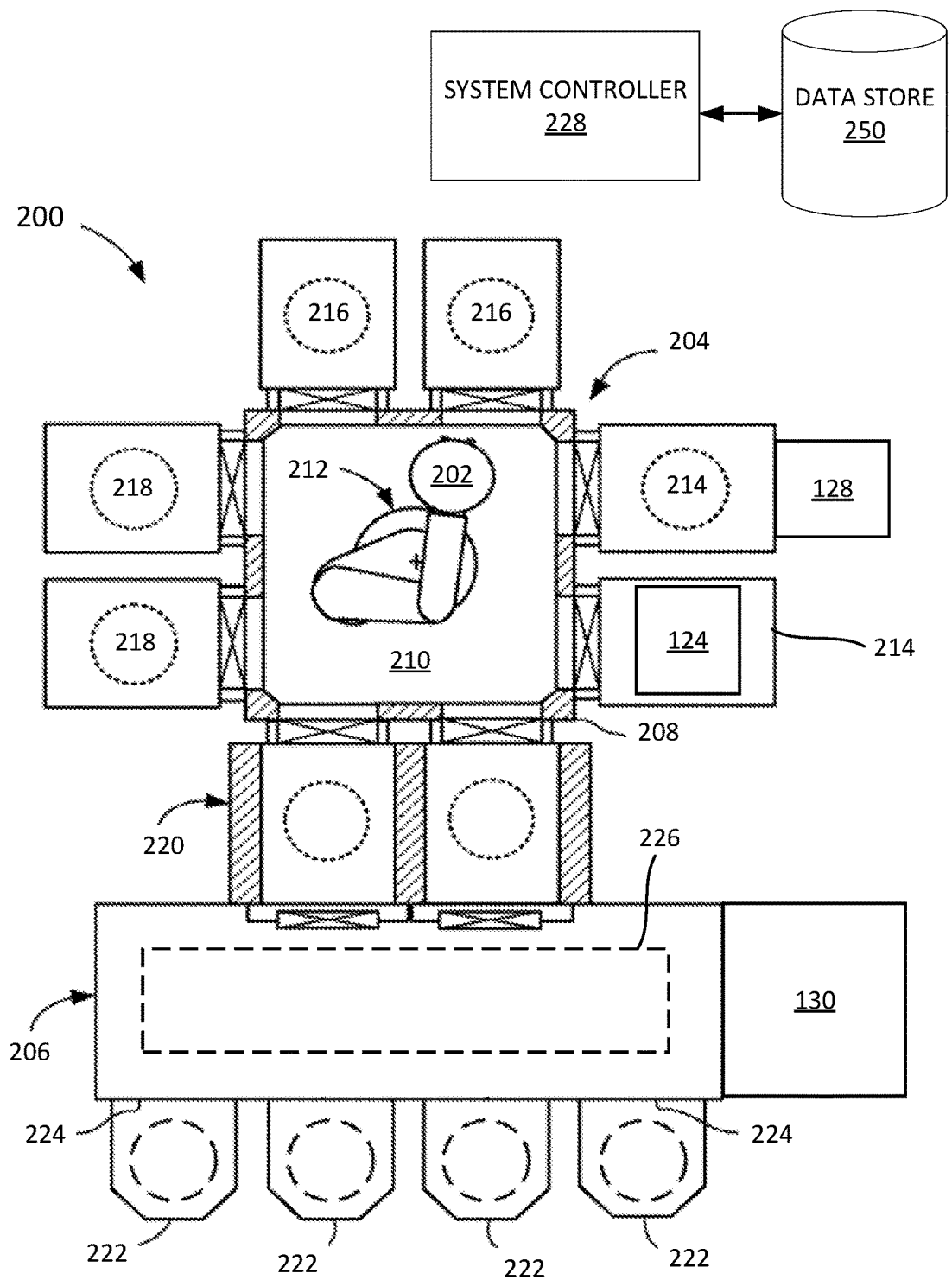
FIG. 2 is a top schematic view of an example manufacturing system, according to aspects of the present disclosure.

FIG. 2 is a top schematic view of an example manufacturing system 200, according to aspects of the present disclosure. Manufacturing system 200 can perform one or more processes on a substrate 202. Substrate 202 can be any suitably rigid, fixed-dimension, planar article, such as, e.g., a silicon-containing disc or wafer, a patterned wafer, a glass plate, or the like, suitable for fabricating electronic devices or circuit components thereon, according to aspects of the present disclosure. In some embodiments, manufacturing system 200 can be include or be a part of system architecture 100, in accordance with embodiments described with respect to FIG. 1.

Manufacturing system 200 can include a process tool 204 and a factory interface 206 coupled to process tool 204. Process tool 204 can include a housing 208 having a transfer chamber 210 therein. Transfer chamber 210 can include one or more processing chambers (also referred to as process chambers) 214, 216, 218 disposed therearound and coupled thereto. Processing chambers 214, 216, 218 can be coupled to transfer chamber 210 through respective ports, such as slit valves or the like. Transfer chamber 210 can also include a transfer chamber robot 212 configured to transfer substrate 202 between process chambers 214, 216, 218, load lock 220, etc. Transfer chamber robot 212 can include one or multiple arms where each arm includes one or more end effectors at the end of each arm. The end effector can be configured to handle particular objects, such as wafers.

In some embodiments, transfer chamber 210 can also include metrology equipment, such as integrated metrology equipment 128, described with respect to FIG. 1. Integrated metrology equipment 128 can be configured to generate metrology data associated with substrate 202 before or during a substrate process, while the substrate is maintained in a vacuum environment. As illustrated in FIG. 2, integrated metrology equipment 128 can be disposed within transfer chamber 210. In other or similar embodiments, integrated metrology equipment 128 can be coupled to transfer chamber 210. As integrated metrology equipment 128 is disposed within or coupled to transfer chamber 210, metrology data associated with substrate 202 can be generated without substrate 202 being removed from the vacuum environment (e.g., transferred to factory interface 206.

Process chambers 214, 216, 218 can be adapted to carry out any number of processes on substrates 202. A same or different substrate process can take place in each processing chamber 214, 216, 218. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. In some embodiments, chamber status equipment, such as chamber status equipment 124 described with respect to FIG. 1, can be coupled to or disposed within a process chamber 214, 216, 218. Chamber status equipment 124 can be configured to collect spectral data. The spectral data may include OES data associated with a plasma of the processing chambers 214, 216, 218 and reflectivity data for a profile of a surface of the substrate during a substrate process. A processing device coupled to chamber status equipment 124 (e.g., system controller 228) can determine, based on the collected spectral data, chamber condition metrics (e.g., indicating whether the chamber is operating under normal or abnormal conditions) of a processing chamber 214, 216, 218 performing an etch process. In some embodiments, the one or more components of chamber status equipment 124 can include components described with respect to FIG. 5 (e.g., optical fiber bundle, collimator assembly, etc.). In other or similar embodiments, chamber status equipment 124 can include one or more sensors disposed within or outside of process chambers 214, 216, 218 and configured to collect spectral data for a portion of substrate 202 and/or an environment within process chamber 214, 216, 218, before, after, or during a substrate process.

A load lock 220 can also be coupled to housing 208 and transfer chamber 210. Load lock 220 can be configured to interface with, and be coupled to, transfer chamber 210 on one side and factory interface 206 on another side. Load lock 220 can have an environmentally-controlled atmosphere that can be changed from a vacuum environment (wherein substrates can be transferred to and from transfer chamber 210) to an atmospheric-pressure (or near atmospheric-pressure) inert-gas environment (wherein substrates can be transferred to and from factory interface 206), in some embodiments.

Factory interface 206 can be any suitable enclosure, such as an Equipment Front End Module (EFEM). Factory interface 206 can be configured to receive substrates 202 from substrate carriers 222 (e.g., Front Opening Unified Pods (FOUPs)) docked at various load ports 224 of factory interface 206. A factory interface robot 226 (shown dotted) can be configured to transfer substrates 202 between substrate carriers (also referred to as containers) 222 and load lock 220. In other and/or similar embodiments, factory interface 206 can be configured to receive replacement parts from replacement parts storage containers 222.

In some embodiments, manufacturing system 200 can include metrology equipment that is configured to generate metrology data associated with substrate 202 outside of the vacuum environment. For example, as illustrated in FIG. 2, integrated metrology equipment 128 can be coupled to a process chamber (e.g., process chamber 214, 216, and/or 218). Integrated metrology equipment 128 can be configured to generate metrology data associated with substrate 202 prior to substrate 202 being placed in the vacuum environment (e.g., transferred to load lock 220) and/or after substrate 202 is removed from the vacuum environment (e.g., removed from load lock 220). It should be noted that although FIG. 2 depicts inline metrology equipment 130 coupled to factory interface 206, inline metrology equipment 130 can be coupled to any part of the process tool 204 that is outside of the vacuum environment (e.g., coupled to load lock 220, etc.).

Manufacturing system 200 can also be connected to a client device (e.g., client device 120 of FIG. 1) that is configured to provide information regarding manufacturing system 200 to a user (e.g., an operator). In some embodiments, the client device can provide information to a user of manufacturing system 200 via one or more graphical user interfaces (GUIs). For example, the client device can provide information regarding one or more chamber condition metrics (e.g. while performing a substrate process) of a processing chamber 214, 216, 218 via a GUI.

Manufacturing system 200 can also include or be coupled to a system controller 228. System controller 228 can be and/or include a computing device such as a personal computer, a server computer, a programmable logic controller (PLC), a microcontroller, and so on. System controller 228 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 228 can include a data storage device (e.g., one or more disk drives and/or solid state drives), a main memory, a static memory, a network interface, and/or other components. System controller 228 can execute instructions to perform any one or more of the methodologies and/or embodiments described herein. In some embodiments, system controller 228 can execute instructions to perform one or more operations at manufacturing system 300 in accordance with a process recipe. The instructions can be stored on a computer readable storage medium, which can include the main memory, static memory, secondary storage and/or processing device (during execution of the instructions).

In some embodiments, system controller 228 can receive data from sensors or other components (e.g., chamber status equipment 124) included on or within various portions of manufacturing system 200 (e.g., processing chambers 214, 216, 218, transfer chamber 210, load lock 220, etc.). Data received by the system controller 228 can include spectral data and/or non-spectral data for a portion of substrate 202. For purposes of the present description, system controller 228 is described as receiving data from chamber status equipment 124 coupled to or disposed within process chambers 214, 216, 218. However, system controller 228 can receive data from any portion of manufacturing system 200 and can use data received from the portion in accordance with embodiments described herein. In an illustrative example, system controller 228 can receive spectral data from an chamber status equipment 124 coupled to a process chamber 214, 216, 218 before, after, or during a substrate process at the processing chamber 214, 216, 218. Data received from chamber status equipment 124 or other sensors at manufacturing system 200 can be stored in a data store 250. Data store 250 can be included as a component within system controller 228 or can be a separate component from system controller 228. In some embodiments, data store 250 can be or include a portion of data store 150, as described with respect to FIG. 1.

Figure 3:
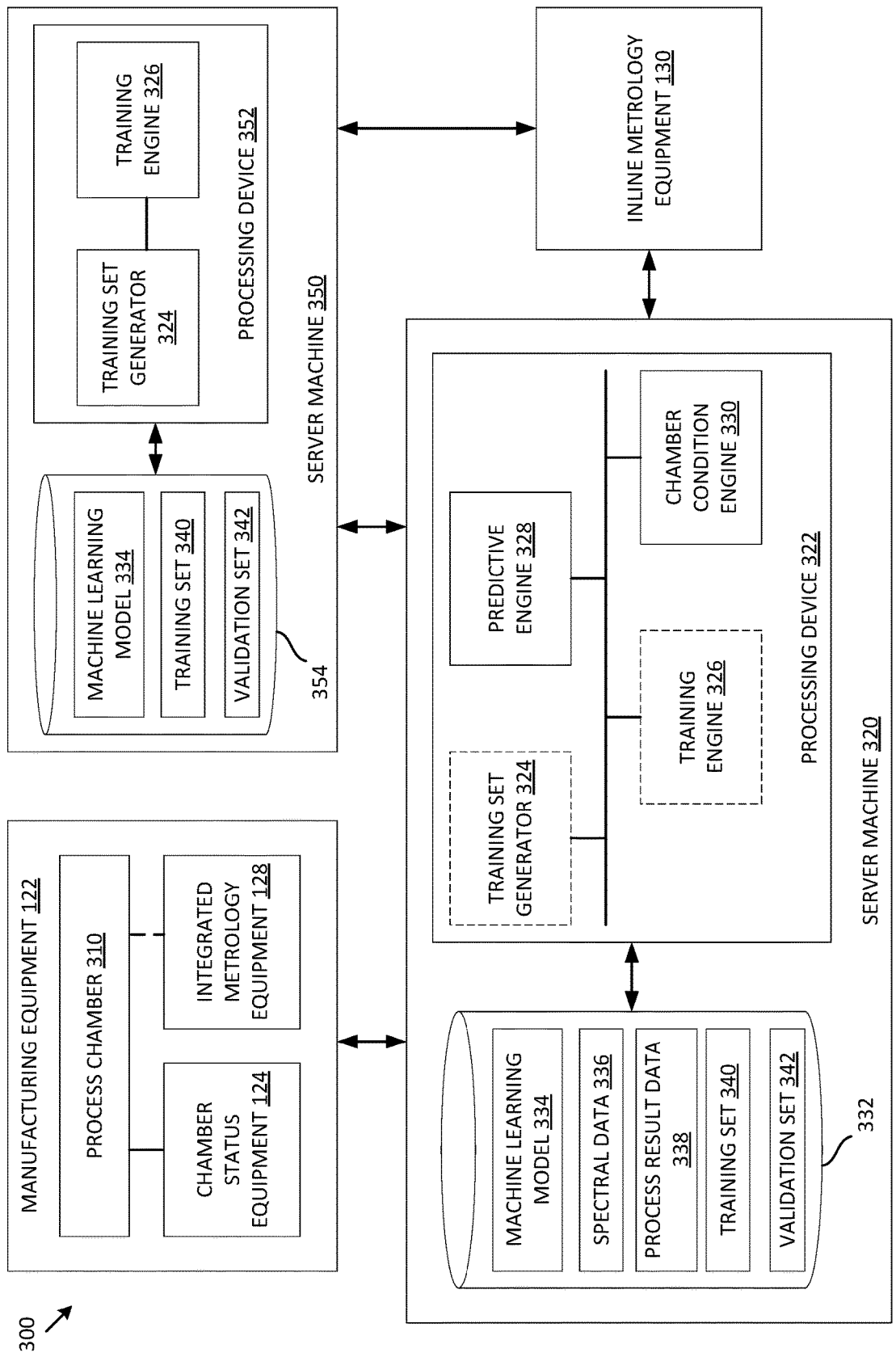
FIG. 3 depicts an illustrative system architecture for chamber condition prediction of a processing chamber, according to aspects of the present disclosure.

FIG. 3 depicts an illustrative system architecture 300 for chamber condition prediction of a processing chamber (e.g., performing a substrate process), according to aspects of the present disclosure. In some embodiments, chamber condition prediction system 300 can include or be a part of one or more components of system architecture 100 and/or manufacturing system 200. Chamber condition prediction system 300 can include one or more components of manufacturing equipment 122 (e.g., chamber status equipment 124), metrology equipment 130, server machine 320, and server machine 350.

As described previously, manufacturing equipment 122 can produce products following a recipe or performing runs over a period of time. Manufacturing equipment 122 can include a process chamber 310 configured to perform a substrate process for a substrate according to a substrate process recipe. In some embodiments, process chamber 310 can be any of process chamber 214, 218, 218, described with respect to FIG. 2. Manufacturing equipment 122 can also include chamber status equipment 124, as described herein. Chamber status equipment 124 can be coupled to or disposed within process chamber 310 and can collect spectral data to be used to detect an endpoint of a step of the substrate process recipe. In some embodiments, manufacturing equipment 122 can also include integrated metrology equipment 128, as described herein. Integrated metrology equipment 128 can be configured to generate metrology data associated with the substrate before or after the substrate process is completed.

Manufacturing equipment 122 can be coupled to server machine 320. Server machine 320 can include processing device 322 and/or data store 332. In some embodiments, processing device 322 can be configured to execute one or more instructions to perform operations at manufacturing equipment 122. For example, processing device 322 can include or be a part of system controller 228, described with respect to FIG. 2. Data store 332 can include or be part of data store 150 and/or data store 250, in some embodiments.

Processing device 322 can be configured to receive data from one or more components of manufacturing equipment 122 (i.e., via a network). For example, processing device 322 can receive spectral data 336 (e.g., OES data of a plasma disposed within the chamber, optical reflectance measurement corresponding to a reflectance pattern of light reflected off a surface of the a substrate disposed within the processing chamber) collected by chamber status equipment 124 during a substrate process for a substrate at process chamber 310. In another example, processing device 322 can receive metrology data 338 collected by integrated metrology equipment 128 before and/or after the substrate process for the substrate. Metrology data 338 can include a metrology measurement value generated for the substrate by integrated metrology equipment 128. In some embodiments, processing device 322 can store the received spectral data and/or the received metrology data 338 at data store 332.

In some embodiments, processing device 322 can receive metrology data 338 from other metrology equipment. For example, in some embodiments, server 320 can be coupled to inline metrology equipment 130 (i.e., via a network). A substrate can be removed from process chamber 210 and transferred to inline metrology equipment 130, as described herein. Inline metrology equipment 130 can generate metrology data 338 for the substrate and transmit the generated metrology data 338 to processing device 322 via the network. In another example, the substrate can be removed from manufacturing equipment 122 and can be transferred to external metrology equipment, such as external metrology equipment 132 described with respect to FIG. 1. A client device, such as client device 120, can be coupled to server 320 (i.e., via the network). In some embodiments, a user of manufacturing equipment 122 can obtain metrology data 338 using external metrology equipment 132 and can provide the obtained metrology data 338 via a GUI of client device 120. Client device 120 can transmit metrology data 338 via the network. In additional or alternative embodiments, external metrology equipment 132 can be coupled to server 320 via the network and external metrology equipment 132 can transmit metrology data 338 directly to processing device 352.

Processing device 352 can include a predictive engine 328 and a chamber condition engine 330. Predictive engine 328 can be configured to provide a value for a metrology measurement based on spectral data 336 collected for a substrate during a substrate process. For example, predictive engine 328 can provide spectral data 336 collected for a current process performed for a current substrate at process chamber 310 as input to a trained machine learning model 334. Predictive engine 328 can obtain, as an output of machine learning model 334, predicted metrology data 338 including an indication of the metrology measurement value that corresponds to the current substrate. In some embodiments, predictive engine 328 can correspond to predictive engine 114, described with respect to FIG. 1.

Chamber metric engine 330 at processing device 322 can be configured to determine chamber conditions of a processing chamber 310 performing a substrate process. Chamber condition engine 330 can obtain or determine one or more chamber condition metrics for a process chamber 310 processing a current substrate from predictive engine 328. Chamber condition metrics may include a selection of values each associated with a combination, feature, or pattern identified in the input data to the predictive engine 328. For example, a first value may be indicative of a certain spectral data and sensor data combination at a given time. In another example, another value may be associated with a gradient of one or more variable combination determine and/or identified by the predictive engine 328. In some embodiments, the chamber conditions metric may include a series of values (e.g., vector, matrix, etc.) indicating a correlation of a particular data combination, correlation, pattern, and/or relationship present in the sensor data. For example, the chamber condition metric may include a feature vector including binary values indicating the presence or absence of a particular feature in the data.

The chamber condition metrics may be compared against a known pattern and/or combination of chamber metrics (e.g., target chamber metrics). Target chamber metrics may be associated with one or more stages of a recovery process (e.g., seasoning procedure) In response to determining that the chamber condition metrics satisfy one or more chamber condition threshold (e.g., conditions relating to a recovery process of the process chamber), chamber condition engine 330 can modify a performance of the processing chamber 310 (e.g., by generating an instruction including a command to alter a process parameter). A chamber condition threshold may be a specified combination of values indicated by the chamber condition metrics. For example, chamber condition engine 330 may determine an update to a least process recipe associated with the received sensor data based on determining one or more chamber conditions are present in the process chamber based on identified patterns, features, correlations, relationship between the chamber condition metrics received by predictive engine 328. For example, the modification may be associated with a current substrate process such as processing a current substrate according to updated process parameters. In another example, the modification may include halting a current substrate process. In another example, the modification may include a change to a process recipe used to process a future substrate. Processing device 322 can transmit the instruction to manufacturing equipment 122, causing the modification to the identified performance of the processing chamber. For example, the instruction may command the process chamber to continue to process a substrate according to an updated set of process parameters. In another example, the instruction may include causing substrate processing within the processing chamber to halt. In Some embodiments, the target chamber metrics is associated with a stage of a PM recovery procedure. Further details associated with predicting chamber conditions of a processing chamber processing a substrate according to a current process are provided with respect to FIG. 7.

As illustrated in FIG. 3, processing device 322 can include a training set generator 324 and/or a training engine 326, in some embodiments. In some embodiments, training set generator 324 can correspond to training set generator 172 and/or training engine 326 can correspond to training engine 182, described with respect to FIG. 1. Training set generator 324 can be configured to generate training sets 340 to train machine learning model 334 or a set of machine learning models 334. For example, training set generator 324 can generate a training input based on historical spectral data 336 associated with a prior substrate. In some embodiments, training set generator 324 can retrieve the historical spectral data 336 from data store 332 to generate the training input. Training set generator 324 can generate a target output indicating a chamber condition (e.g., chamber condition metrics) for the training input based on historical metrology data 338 obtained for the prior substrate. As described above, historical metrology data 338 can be generated by inline metrology equipment 130, integrated metrology equipment 128, or external metrology equipment 132. Training set generator 324 can include the generated training input and the generated target output in a training set 340. Further details regarding generating training set 340 are provided with respect to FIG. 4.

Training engine 326 can be configured to train, validate and/or test the machine learning model 334 or sets of machine learning models 334. Training engine 326 can provide training set 340 to train machine learning model(s) 334 and store trained machine learning model(s) 334 at data store 332. In some embodiments, training engine 326 can use a validation set 342 to validate a trained machine learning model 334. Validation set 342 can include spectral data 336 and chamber condition metrics corresponding to metrology data 338 obtained for a prior substrate (i.e., processed at process chamber 310 or at another process chamber). Training set generator 324 and/or training engine 326 can generate validation set 342 based on historical spectral data 336 and historical metrology data 338 obtained for a prior substrate. In some embodiments, validation set 342 can include historical spectral data 336 and historical metrology data 338 that is different from historical spectral data 336 and historical metrology data 338 included in training set 340.

Training engine 326 can provide the spectral data 336 (and sensor data in some embodiments) for the prior substrate as an input to a trained machine learning model 334 and can extract a chamber condition metric for a processing chamber processing the prior substrate from one or more outputs of the trained model 334. Training engine 326 can assign a performance score to the trained model 334 based on an accuracy of the chamber condition metric for the processing chamber processing the prior substrate in view a measured chamber condition of the metrology data 338 for the prior substrate included in the validation set 342. Training engine 326 can select the trained model 334 to be used to provide future metrology measurement values for future substrates processed at the process chamber 310 in response to determining the performance score satisfies a performance score criterion (e.g., exceeds a performance score threshold). Further details regarding selecting a trained model 334 are provided with respect to FIG. 9.

As discussed previously, training set generator 324 and/or training engine 326 can be components of processing device 322 at server 320, in some embodiments. In additional or alternative embodiments, training set generator 324 and/or training engine 326 can be components of processing device 352 at server 350. Server 350 can include or be part of a computing system that is separate from manufacturing system 200. As described previously, server 320 can include or be part of system controller 228, described with respect to FIG. 2, in some embodiments. In such embodiments, server 350 can include or be part of a computing system that is coupled to system controller 228 (i.e., via a network), but is separate from system controller 228. For instance, a user of manufacturing system 200 may be provided with access to data stored at one or more portions of data store 332 or one or more processes executed at processing device 322. However, the user of manufacturing system 200 may not be provided with access to any data stored at one or more portions of data store 354 or any processes executed at processing device 352.

Processing device 352 can be configured to execute training set generator 324 and/or training engine 326 in a similar fashion as processing device 322. In some embodiments, server 350 can be coupled to manufacturing equipment 122 and/or inline metrology equipment 130 via a network. As such, processing device 352 can obtain spectral data 336 and chamber condition metrics corresponding to metrology data 338 to be used by training set generator 324 and/or training engine 326 to generate training set 340 and validation set 342, in accordance with embodiments described with respect to processing device 322. In other or similar embodiments, server 350 is not coupled to manufacturing equipment 122 and/or external metrology equipment 132. Accordingly, processing device 352 can obtain spectral data 336 and/or metrology data 338 from processing device 322. For example, processing device 322 can receive spectral data 336 from chamber status equipment 124, as previously described. Processing device 322 can transmit the received spectral data 336 to processing device 352 (i.e., via a network). Processing device 352 can store spectral data 336 at data store 354, in some embodiments. In some embodiments, processing device 322 can similarly transmit metrology data 338 obtained for a substrate to processing device 352. For example, processing device 322 can receive metrology data 338 from inline metrology equipment 130, integrated metrology equipment 128 and/or external metrology equipment 132, as previously described. Processing device 352 can transmit the received metrology data 338 from processing device 322 and, in some embodiments, store metrology data 338 at data store 354.

Training set generator 324 at processing device 352 can generate training set 340 in accordance with previously described embodiments. Training engine 326 at processing device 352 can train and/or validate machine learning model 334, in accordance with previously described embodiments. In some embodiments, server 350 can be coupled to other manufacturing equipment and/or other server machines that are different from manufacturing equipment 122 and/or server machine 320. Processing device 352 can obtain spectral data 336 and/or metrology data 338 from the other manufacturing equipment and/or server machines, in accordance with embodiments described herein. In some embodiments, training set 340 and/or validation set 342 can be generated based on spectral data 336 and metrology data 338 obtained for substrates processed at process chamber 310 as well as other spectral data and metrology data obtained for other substrates processed at process chambers at other manufacturing systems.

In response to training engine 326 selecting trained model 334 to be applied to future spectral data for future substrates at process chamber 310, processing device 352 can transmit trained model 334 to processing device 322. Predictive engine 328 can use trained model 334 to provide metrology measurement values for future substrates at process chamber 310, as previously described.

Figure 4:
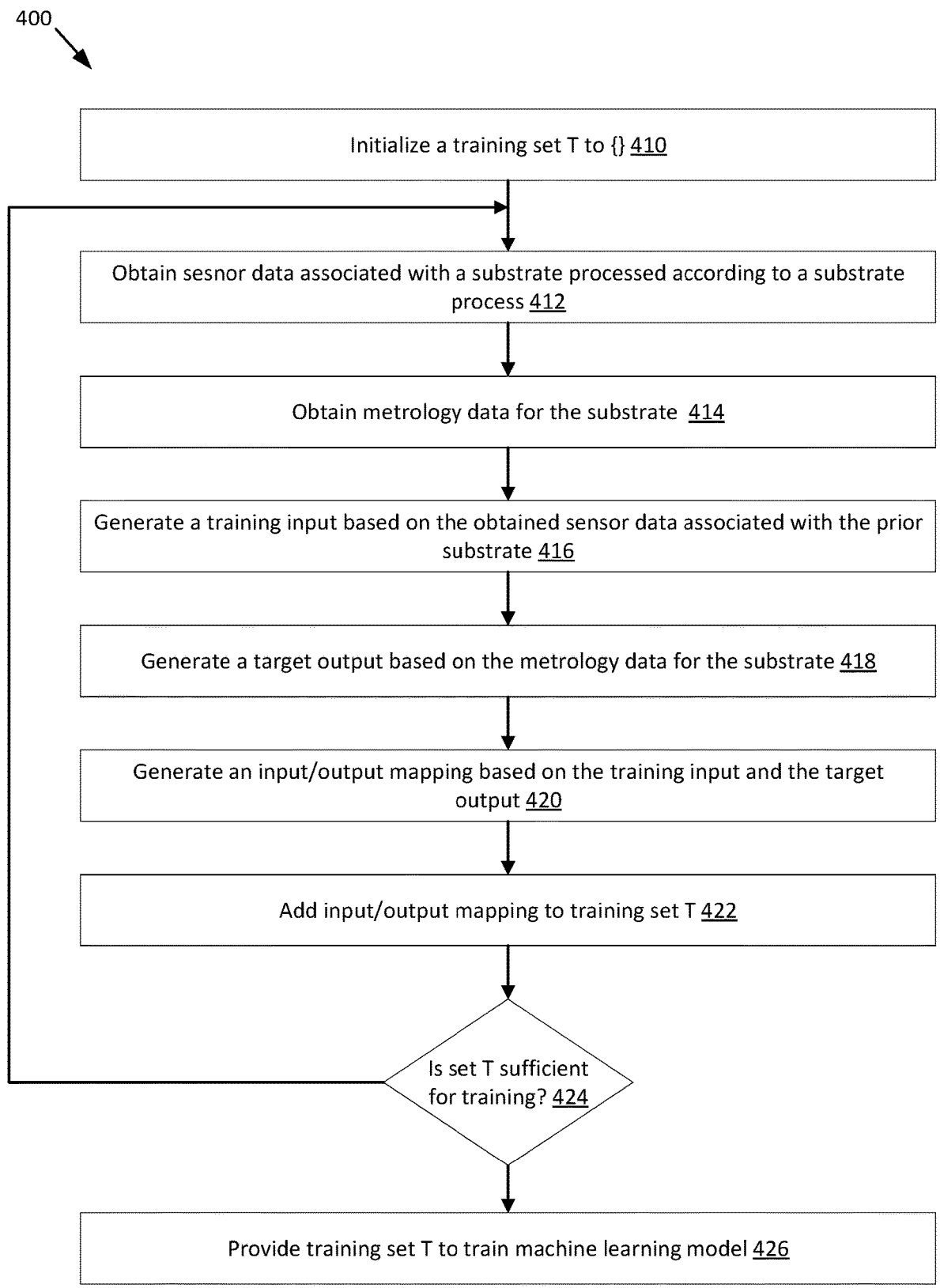
FIG. 4 is a flow chart of a method for training a machine learning model, according to aspects of the present disclosure.

FIG. 4 is a flow chart of a method 400 for training a machine learning model, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by a computer system, such as system architecture 100 of FIG. 1. In other or similar implementations, one or more operations of method 400 can be performed by one or more other machines not depicted in the figures. In some aspects, one or more operations of method 400 can be performed by training set generator 324 of server machine 320 or server machine 350, described with respect to FIG. 3.

At block 410, processing logic initializes a training set T to an empty set (e.g., { }). At block 412, processing logic obtains spectral data and/or chamber data associated with a substrate processed at a process chamber of a manufacturing system. In some embodiments, the spectral data and/or chamber data can be received from one or more sensors disposed within or coupled to the process chamber. In other or similar embodiments, the spectral data can be received from chamber status equipment disposed within or coupled to the process chamber.

Referring back to FIG. 4, at block 414, processing logic obtains metrology data for the substrate. As described previously, metrology data can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). In some embodiments, the metrology measurements can be received from metrology equipment of manufacturing system 200 (e.g., inline metrology equipment 130, integrated metrology equipment 128, etc.). For example, after the substrate process is completed, the substrate can be transferred to inline metrology equipment 130 or integrated metrology equipment 130 of manufacturing system 200. Inline metrology equipment 130 or integrated metrology equipment 128 can generate metrology data associated with the substrate and can transmit the metrology data to a computing device including the processing logic (e.g., server machine 320, server machine 350, etc.) via a network. In other or similar embodiments, the metrology measurements can be received from metrology equipment that is separate from manufacturing system 200 (e.g., external metrology equipment 132), as described herein.

At block 416, processing logic generates a training input based on the spectral data obtained for the substrate at block 412. In some embodiments, the training input can include a normalized set of spectral data (e.g., including both OES data and substrate surface reflectometer data as described herein) generated based on the spectral data obtained for the processing device and the substrate. The normalized set of spectral data can include one or more spectral features that correspond to a particular type of metrology measurement. The spectral features may be based on combinations of optical emission measurements and optical reflectance spectra measurements. Further details regarding generating the training input are described with respect to FIG. 6. At block 418, processing logic can generate a target output based on the metrology data obtained for the substrate at block 414. The target output can correspond to chamber condition metrics (data indicative of patterns of metrology measurements) corresponding to metrology measurements associated with the substrate. For example, at block 414, processing logic can obtain metrology data indicating a thickness of a film at one or more portions of a surface for a substrate after an etch process. The thickness may be indicate of a condition of the chamber (e.g., a chamber that is not fully recovered from a recovery process or cold chamber). Processing logic can generate a target output corresponding the identified chamber condition (e.g., abnormal chamber condition, normal chamber conditions, not fully recovered, not fully seasoned, etc.).

At block 420, processing logic generates an input/output mapping. The input/output mapping refers to the training input that includes or is based on data for the substrate, and the target output for the training input, where the target output identifies a metrology measurement value for the substrate, and where the training input is associated with (or mapped to) the target output. At block 422, processing logic adds the input/output mapping to the training set T.

At block 424, processing logic determines whether the training set, T, includes a sufficient amount of training data to train a machine learning model. It should be noted that in some implementations, the sufficiency of training set T can be determined based simply on the number of input/output mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set, T, includes a sufficient amount of training data to train the machine learning model, processing logic provides the training set, T, to train the machine learning model. Responsive to determining the training set does not include a sufficient amount of training data to train the machine learning model, method 400 returns to block 412.

At block 426, processing logic provides the training set T to train the machine learning model. In some embodiments, the training set T is provided to training engine 326 of server machine 320 and/or server machine 350 to perform the training. In the case of a neural network, for example, input values of a given input/output mapping (e.g., spectral data and/or chamber data for a previous substrate) are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 426, machine learning model 190 can be used to provide chamber conditions (e.g., chamber condition metrics) for future processing chambers processing future substrates (for example, in accordance with method 800 of FIG. 8 described below).

Figure 5:
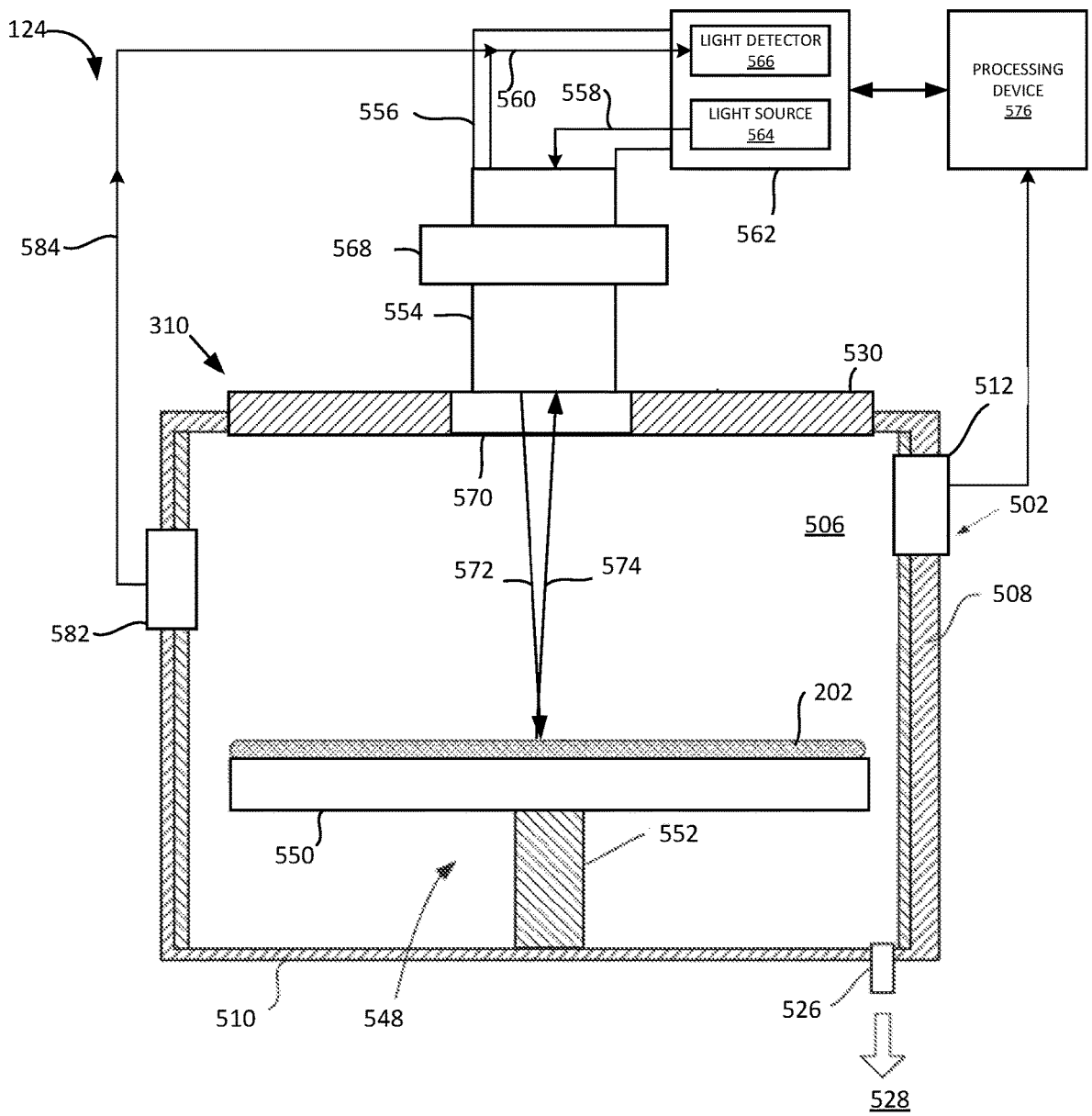
FIG. 5 is a cross-sectional schematic side view of chamber status equipment, according to aspects of the present disclosure.

FIG. 5 is a cross-sectional schematic side view of chamber status equipment 124 coupled to a process chamber 310, according to aspects of the present disclosure. In some embodiments, process chamber 310 can be used for processes in which a corrosive plasma environment is provided. For example, the process chamber 310 can be a chamber for a plasma etcher or plasma etch reactor, a plasma cleaner, and so forth. In other or similar embodiments, process chamber 310 can be used for processes in which a non-corrosive environment is provided. For example, process chamber 310 can be used as a chemical vapor deposition (CVD) chamber, a physical vapor deposition (PVD) chamber, an atomic layer deposition (ALD) chamber, an ion assisted deposition (IAD) chamber, and other types of processing chambers.

Briefly, process chamber 310 includes a chamber body 502 and a lid 530 and/or a showerhead (not shown) that encloses an interior volume 506. Chamber body 502 generally includes sidewalls 508 and a bottom 510. The showerhead can include a showerhead base and a showerhead gas distribution plate. The lid 530 and/or the showerhead can be supported on sidewall 508 of the chamber body 502. The lid 530 (or showerhead) can be opened to allow access to the interior volume 506 of process chamber 310, and can provide a seal for the process chamber 310 while closed. A gas panel (not shown) can be coupled to process chamber 310 to provide process and/or cleaning gases to interior volume 506 through lid 530 and a nozzle (e.g., through apertures of the showerhead or lid and nozzle) and/or the showerhead. An exhaust port 526 can be defined in chamber body 502, and can couple interior volume 506 to a pump system 528. Pump system 528 can include one or more pumps and throttle valves utilized to evacuate and regulate the pressure of interior volume 506 of process chamber 310. A substrate support assembly 548 is disposed in interior volume 506 below the lid 530 and/or the showerhead. Substrate support assembly 548 holds a substrate, such as substrate 202 of FIG. 2, during processing. In one embodiment, substrate support assembly 548 includes a pedestal 552 that supports an electrostatic chuck 550.

Chamber status equipment 124 can be configured to optically monitor an environment of interior volume 506 during a substrate process for substrate 202. In some embodiments, chamber status equipment 124 can be mechanically coupled to chamber body 502 and optically interfaced (i.e., via optical interface 570) with the environment of interior volume 506. Chamber status equipment 124 can include a collimator assembly 554, an optical fiber bundle 556, a light component 562, a processing device 576 and, in some embodiments, a polarizer component 586. As illustrated in FIG. 5, collimator assembly 554 can be coupled to chamber interface 570. In some embodiments, chamber interface 570 can be an orifice, a converging or diverging lens, a transparent slab, or any other device or material that is capable of transferring light between collimator assembly 554 and the environment of interior volume 506. It should be noted that although FIG. 5 depicts chamber interface 570 as being embedded within lid 530, chamber interface 570 can be embedded within or coupled to any portion of process chamber 310 (e.g., sidewall 508, bottom 510, etc.).

A first end of optical fiber bundle 556 can be coupled to collimator assembly 554 and a second end of optical fiber bundle 556 can be coupled to light component 562. Light component 562 can include a light source 564 configured to generate light. Herein, "light" refers to electromagnetic radiation of any spectral range, including visible, far and near infrared (IR), far and near ultraviolet (UV), and so forth. "Light" can further include unpolarized (e.g., natural) light, linearly, circularly, or elliptically polarized light, partially-polarized light, focused light, diverging light, collimated light, and so on. In some embodiments, light source 564 can include a narrow-band light source, such as a light-emitting diode (LED), a laser, a light bulb, etc. In other or similar embodiments, light source 564 can include a broadband light source. Light source 564 can include more than one component light sources, such as multiple narrow-band light sources producing (when taken together) a broadband light input, in some embodiments. Light source 564 can include additional optical elements (i.e., filters, absorbers, polarizers, etc.) to control a spectral distribution and/or polarization of the light.

Light generated by light source 564 (referred to as input light herein) can be transmitted to collimator assembly 554 through one or more emitting optical fibers 558 of optical bundle 556. In response to receiving the input light via emitting optical fibers 558, collimator assembly 554 can be configured to convert the input light into a light beam 572. For example, the input light can pass via one or more optical elements of collimator assembly 554, such as lenses, reflectors, filters, apertures, and so forth. In some embodiments, spatial properties of the light beam produced by collimator assembly 554 can be the same for multiple spectral components of light beam 572. For example, a diameter of light beam 572 can be the same within a broad range of wavelengths 2 of various spectral components contained in the input light and, therefore in light beam 572. In some embodiments, collimator assembly 554 can include one or more achromatic lenses. Accordingly, the light beam 572 generated by collimator assembly 554 can be an achromatic light beam.

As illustrated in FIG. 5, in some embodiments, collimator assembly 554 can include a polarizer component 568. Polarizer component 568 is configured to polarize unpolarized (e.g., natural) light generated by light source 564. For example, polarizer component 568 can convert unpolarized input light into linearly, circularly, or elliptically polarized light. It should be noted that although FIG. 5 illustrates polarizer component 568 as being part of collimator assembly 554, polarizer component 568 can be coupled to any portion of chamber status equipment 124 that passes input light to optical interface 570. For example, polarizer component 568 can be coupled to an outlet of light source 564, to an outlet of the one or more emitting optical fibers 558, between collimator assembly and optical interface 570, etc.

Collimator assembly 554 can direct light beam 572 to a surface of substrate 202 disposed on substrate support assembly 548 via optical interface 570. Light beam 572 can be reflected off the surface of substrate 202 as reflected light beam 574, which is received by collimator assembly 554. One or more receiving optical fibers 560 of optical bundle 556 can transmit reflected light beam 574 to light detector 566 of light component 562. Light detector 566 can include one or more spectrographs, spectrometers, diffraction gratings, mirrors, lenses, photodiodes, and other devices. Light detector 566, alone or in conjunction with processing device 576, can determine one or more optical responses associated with the surface of substrate 202 based on reflected light beam 574. For example, light detector 566 and/or processing device 576 can determine a reflectivity R(2), a refraction index n(2), or any other optical quantity that can be used to characterize substrate 202 based on reflected light 574. In some embodiments, the optical responses can be used to characterize, for substrate 202, a polarization dependence of the reflectivity, an angle of rotation of the polarization plane upon reflection, luminescence intensity, and so on. Spectral data, as described with respect to this application, can refer to data corresponding to the optical responses of reflected light 574 and/or the optical characteristics for substrate 202 derived from the optical responses of reflected light 574.

Chamber status equipment 124 may include an optic sensor 582 that captures plasma emissions of a plasma disposed within interior volume 506. The optic sensor 582 is coupled to a fiber optic 584 that carries an optical signal corresponding to the plasma emissions to light detector 566. Light detector 566 may include an optical emission spectrometer (OES). The OES analyzes the optical signal received from fiber optic 584 to identify emission peaks and patterns within the signal, including identifying specific emission peaks as corresponding to energy transition of specific elements. In some embodiments, spectra and/or information characterizing emission peaks therein may be viewed and/or manipulated on OES. In some of these and in other embodiments, the spectral data can include emission peak information. The spectral data may be transferred to processing device 576 for further processing.

Chamber status equipment 124 may include one or more sensors 512 configured to generate and/or collect sensor data associated with the processing chamber 310. Sensor data can include a value of one or more of temperature (e.g., heater temperature), spacing (SP), pressure, high frequency radio frequency (HFRF), voltage of electrostatic chuck (ESC), electrical current, flow, power, voltage, etc. Sensor data can be associated with or indicative of manufacturing parameters such as hardware parameters, such as settings or components (e.g., size, type, etc.) of the manufacturing equipment, or process parameters of the manufacturing equipment. The sensor data can be provided while the processing device 310 is performing a substrate process. The sensor data can be different for each substrate. The sensor data may be provided to processing device 576.

In some embodiments, processing device 576 can be included as part of a system controller (e.g., system controller 228) for a manufacturing system including process chamber 310. In such embodiments, processing device 576 can store the spectral data generated for substrate 202 at data store coupled to processing device 576 (e.g., data stores 250, 332, 354, etc.). In other or similar embodiments, processing device 576 can be a processing component that is separate from the system controller but is coupled to the system controller via a network. Processing device 576 can transmit the generated spectral data to the system controller for storage at a respective data store of the manufacturing system.

Figure 6:
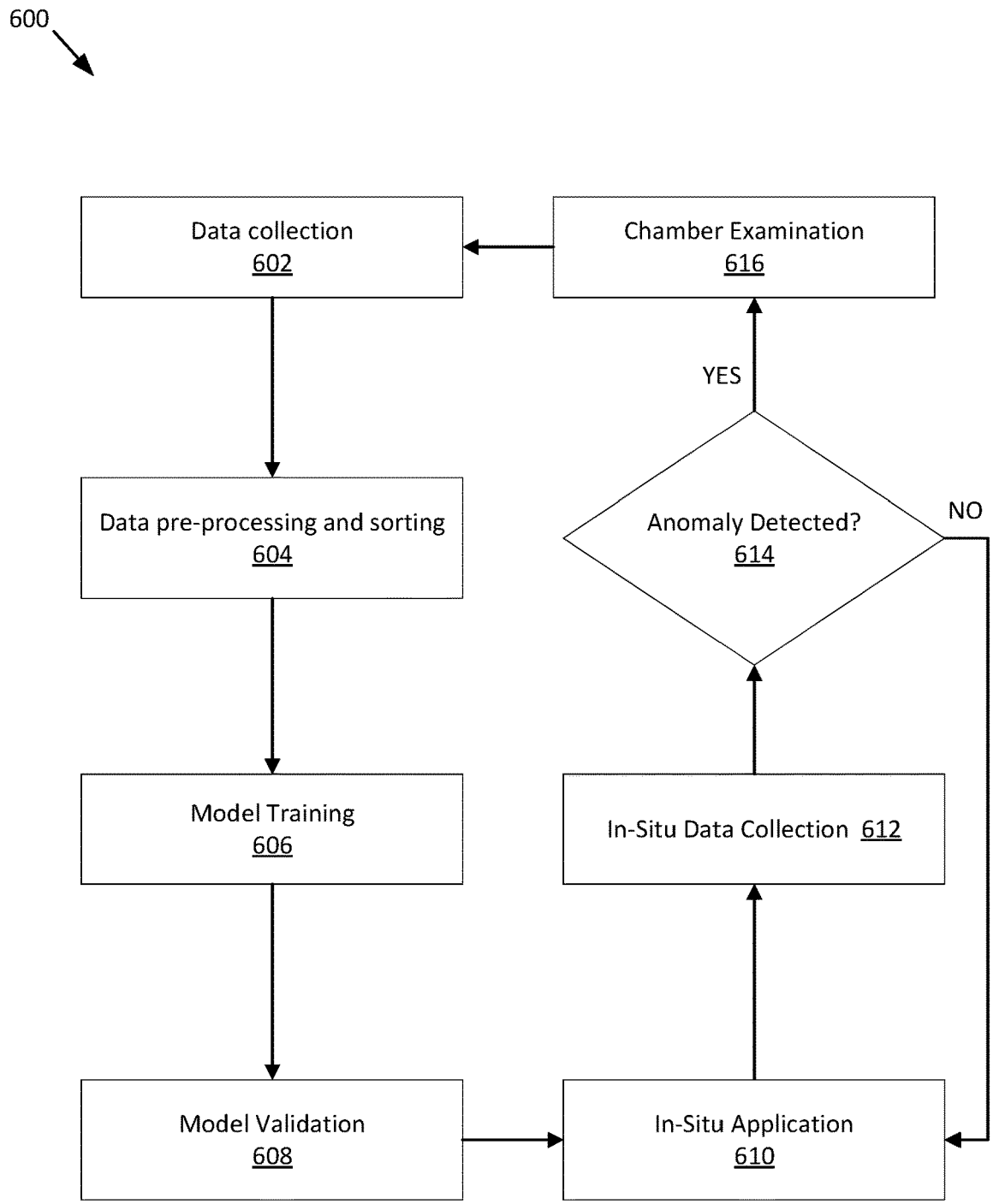
FIG. 6 is a flow chart of a method for training and/or updating a machine learning model for predicting chamber condition of a processing chamber, according to aspects of the present disclosure.

FIG. 6 is a flow chart of a method 600 for training and/or updating a machine learning model for predicting a chamber condition of a processing chamber, according to aspects of the present disclosure. Method 600 is performed by processing logic that can include hardware (circuitry, dedicated logic, etc.), software (such as is run on a general purpose computer system or a dedicated machine), firmware, or some combination thereof. In one implementation, method 600 can be performed by a computer system, such as system architecture 100 of FIG. 1. In other or similar implementations, one or more operations of method 600 can be performed by one or more other machines not depicted in the figures. In some aspects, one or more operations of method 600 can be performed by chamber condition engine 330 of server machine 320, described with respect to FIG. 3.

At block 602, processing logic perform data collection. Data collection may include receiving sensor data including chamber data and spectral data (e.g., OES and reflectometry data), metrology, data labels (process yield, electrical measurements, etc.) from a manufacturing system. The data may be associated with one or more processing chambers processing a one or more substrates. The sensor data may include data acquired by chamber status equipment 124, integrated metrology equipment 128, and/or inline metrology equipment 130. In some embodiments, the spectral data can include optical emission spectra (OES) measurements of a plasma disposed within the processing chamber. In some embodiments, the spectral data can include optical reflectance spectra measurements corresponding to a reflectance pattern of light reflected off a surface of the substrate disposed within the processing chamber. In some embodiments the spectra and chamber data can be received from chamber status equipment, such as chamber status equipment 124, or other sensors disposed within or coupled to the process chamber, in accordance with previously described embodiments.

At block 604, processing logic performs data pre-processing including determining one or more algorithms, size, and speed threshold requirements of a machine-learning to be trained using sensor data. Processing logic generates normalized sensor data that includes an indication of a spectral feature. Processing logic may perform functions and/or methodology to extract features and/or generate synthetic/engineered data associated with the received sensor data. For example, processing logic may perform a feature extraction of the spectral data to identify spectral features. Spectral features may correspond to identified correlations, pattern, and/or abnormalities of the spectral data. In another example, processing logic may perform a feature extraction using combinations of spectral data to determine whether a criterion is satisfied. Processing logic can analyze multiple data points of an associated parameter to determine whether rapid changes occurred to the parameter during a portion of a substrate process. In some embodiments, processing logic performs a normalization across the various sensor data (e.g., spectral data and/or chamber data) associated with various process chamber conditions. A normalization may include processing the incoming sensor data (e.g., spectral data and/or chamber data) to appear similar across the various chambers and sensors used to acquire the data.

In some embodiments, processing logic performs one or more of a data extrapolation procedure and/or a data interpolation procedure to obtain additional data beyond the received measured data points. Processing logic may predict spectral data at time different that the measured values. For example, processing logic may identify one or more features, patterns, and/or relationship between individual data points of the spectral data and use an interpolation procedure to determine estimations of spectral data points (e.g., at different time intervals or at time when a measurement did not occur) occurring at points between captured data points of the measured spectral data (e.g., OES measurements). In another example, processing logic may identify one or more features, patterns, and/or relationships between individual data points of the spectral data and use an extrapolation procedure to determine spectral data points occurring outside the window of time (e.g., spectral data predictions associated with instances before and/or after the acquisition of the spectral data) corresponding to the measured data points of the spectral data.

Processing logic may split the received sensor data into a training set and/or a validation set. The processing logic may further sort the data into groups and assign individual data combinations to one or both of the training set and/or validation set.

At block 606, processing logic performs model training on a set of one or more machine learning algorithms. Each of the set of machine learning models can correspond to a different machine learning model type. For example, each of the set of machine learning models can correspond to a linear regression model, a partial least squares regression model, a Gaussian regression model, a random forest model, a support vector machine model, a neural network, a ridge regression model, a logistic regression type algorithm, a multi-layer perception algorithm, a recurrent neural network (RNN), and so forth. Performing the training of the set of machine learning model may be performed in accordance with embodiments described with respect to method 400 of FIG. 4.

In some embodiments the trained machine learning model is to receive a new input having new sensor data having new chamber data indicating a new state of a new environment of a new processing chamber processing a new substrate according to a new process and new spectral data indicating optical emission spectra (OES) measurements of a new plasma disposed within the new processing chamber processing the new substrate according to the new process to produce a new output based on the new input. The new output indicates a chamber condition metric corresponding to a recovery status associated with a chamber recovery process performed subsequent to a preventative maintenance procedure.

At block 608, processing logic performs validation of the one or more trained machine learning models. Results and statistics from both the training data set and the validation data set are compared and a "best" overall model is selected. Model selection may be determined according to method 900 of FIG. 9. Validation may include determining an accuracy of each of the trained machine learning models based on a corresponding set of features of each training set. Processing logic may discard trained machine learning models that have an accuracy that does not meet a threshold accuracy. Processing logic may determine a trained machine learning model that has the highest accuracy of all of the trained machine learning models based on the testing (and, optionally, validation) sets.

At block 610, one or more models are installed on a server (e.g., an on-tool server). The one or more selected models receive sensor data (e.g., spectral data and chamber data) of a new substrate and predict one or more chamber condition metrics corresponding to process result predictions in one embodiment. A process result prediction may encompass one or more values indicating an estimation of a process result (e.g., film thickness, critical dimension, side wall angle, etc.) of a substrate corresponding to the received sensor data. The chamber condition metrics may include a selection of values each associated with a combination, feature, or pattern identified in the input data to the predictive engine 328. For example, a first value may be indicative of a certain spectral data and sensor data combination at a given time. In another example, another value may be associated with a gradient of one or more variable combination determine and/or identified by the predictive engine 328. In some embodiments, the chamber conditions metric may include a series of values (e.g., vector, matrix, etc.) indicating a correlation of a particular data combination, correlation, pattern, and/or relationship present in the sensor data. For example, the chamber condition metric may include a feature vector including binary values indicating the presence or absence of a particular feature in the data. The chamber condition metrics may be used to alter a performance of the processing chamber. For example, the chamber conditions may be leveraged to update a process parameter of a process recipe. The updates may be based on a difference of determined chamber condition metrics and a target chamber condition metrics associated with a process recipe. In another example, the processing logic may cause a notification to be displayed on a graphical user interface (GUI). The notification may indicate a modification to be taken by the process chamber (or more generally, the manufacturing equipment). For example, processing logic may cause a currently processed substrate or a new substrate to be processed according to an updated set of process parameters. In another example, processing logic may cause a substrate processing within the processing chamber to halt.

At block 612, processing logic perform in-situ data collection of a live substrate process environment. The collected data may include spectral data, metrology data, data labels (e.g., process results such as yield, metrology data, electrical data, etc.). The data may be associated with one or more processing chambers currently processing a substrate. The sensor data may include data acquired by chamber status equipment 124, integrated metrology equipment 128, and/or inline metrology equipment 130. In some embodiments, the spectral data can include optical emission spectra (OES) measurements of a plasma disposed within the processing chamber. In some embodiments, the spectral data can include optical reflectance spectra measurements corresponding to a reflectance pattern of light reflected off a surface of the substrate disposed within the processing chamber. In some embodiments the spectra and chamber data can be received from chamber status equipment, such as chamber status equipment 124, or other sensors disposed within or coupled to the process chamber, in accordance with previously described embodiments.

At block 614, processing logic determines if there is an anomaly in the received in-situ data collected in association with a substrate process based on a comparison of the received data and historical sensor data. Processing logic determines whether metrology and process result labels are satisfactory (e.g., meeting a threshold performance rating) based on a comparison between the metrology data and historical metrology data and associated labels. Processing logic may determine the absence of a processing anomaly and proceeds along the no path to block 610, and continue to process further sensor data and process result data associated the current processing chamber and substrate or with one or more additional processing chamber and/or one or more additional substrates. Processing logic may determine the presence of an anomaly within the received data sets, and proceed along the yes branch to block 616.

In some embodiments, processing logic inputs the received data (e.g., sensor data, spectral data, chamber data, process result data) into a model (e.g., a statistical model). Processing logic receives one or more outputs from the statistical model. The one or more outputs may indicate a level of confidence that temporally associated data points of the chamber data, spectral data, and/or process result data accurately indicate conditions (e.g., cold chamber, recovered chamber, malfunctioning chamber) of the processing chamber. The statistical model may be generated using a regression between historical chamber data, historical spectral data, and/or historical process result data. Processing logic may determine that the level of confidence meets a threshold to determine the presence or absence of an anomaly within the received data.

In some embodiments the statistical model is generated using statistical process control (SPC) analysis to determine control limits for the received data and identify data as being more or less dependable based on those control limits. In some embodiments, the statistical model is associated with univariate and/or multivariate data analysis (e.g., of the historical data). For example, various parameters can be analyzed using the statistical model to determine patterns and correlations through statistical processes (e.g., range, minimum, maximum, quartiles, variance, standard deviation, and so on). In another example, relationships between multiple variables (e.g., chamber data and spectral data) can be ascertained using regression analysis, path analysis, factor analysis, multivariate statistical process control (MCSPC) and/or multivariate analysis of variance (MANOVA).

At block 616, chamber examination is performed. Chamber examination may include an inspection of individual components of a manufacturing system. Processing logic may cause a notification to be displayed on a GUI indicating an error, a data anomaly, and/or a corrective action to be taken. In some embodiments, processing logic initiates the creation, training, validation, and/or selection of one or more new models to perform the actions described herein. In some embodiments processing logic may update the currently used model to correct for the detected anomalies. For example a user may load an old model that specifies the type of mode, the settings/parameters, and old data used to create the model. Processing logic may use the old model as a starting place (e.g., initial guess) for training an updated model. Additional data may be added to the system and used to further train and/or validate the model to generate an updated model.

Figure 7:
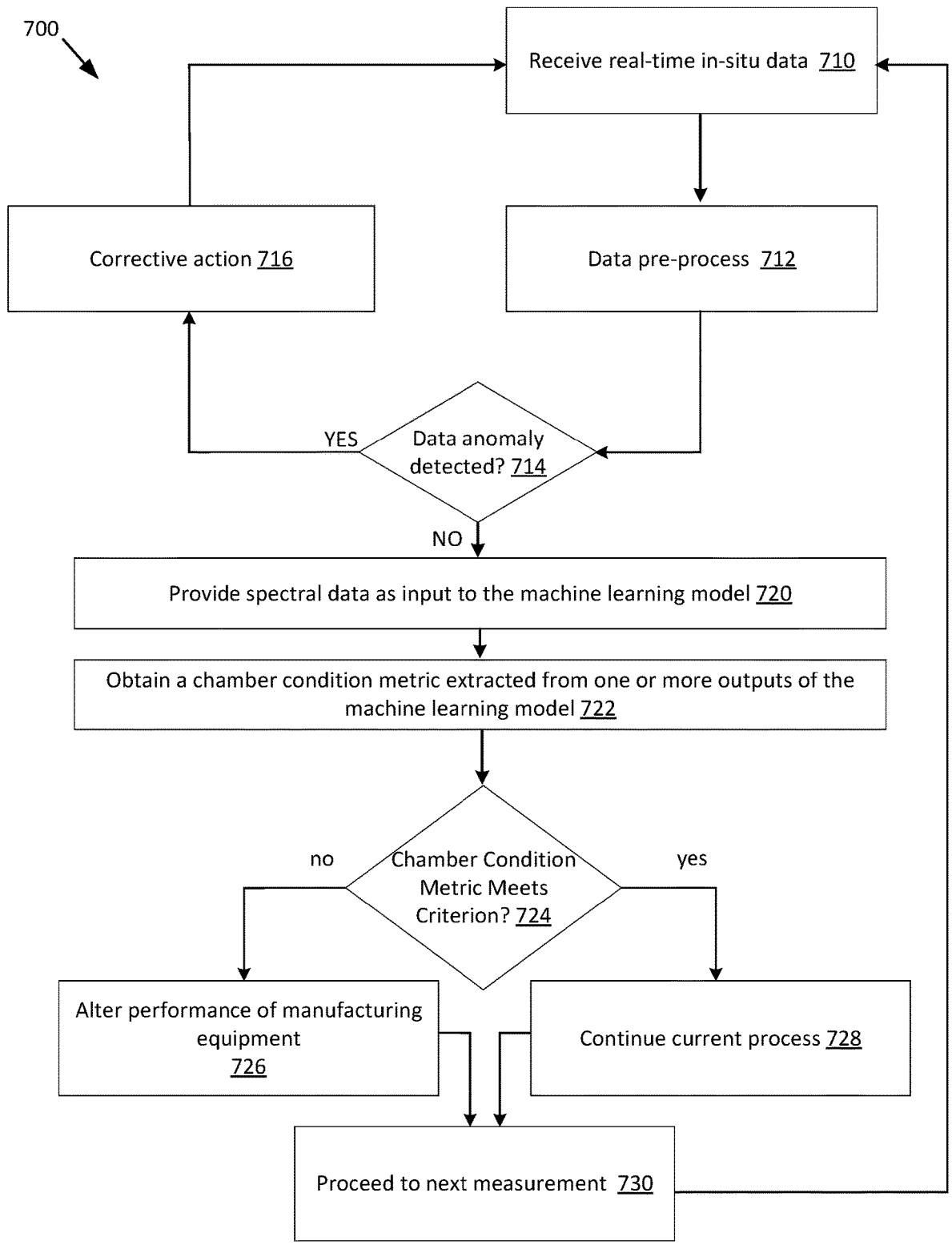
FIG. 7 is a flow chart of a method for training and/or updating a machine learning model for predicting chamber condition of a processing chamber, according to aspects of the present disclosure.

FIG. 7 is a flow chart of a method 700 for training and/or updating a machine learning model for predicting chamber conditions of a processing chamber, according to aspects of the present disclosure. Method 700 is performed by processing logic that can include hardware (circuitry, dedicated logic, etc.), software (such as is run on a general purpose computer system or a dedicated machine), firmware, or some combination thereof. In one implementation, method 700 can be performed by a computer system, such as system architecture 100 of FIG. 1. In other or similar implementations, one or more operations of method 700 can be performed by one or more other machines not depicted in the figures. In some aspects, one or more operations of method 700 can be performed by chamber condition engine 330 of server machine 320, described with respect to FIG. 3.

At block 710, processing logic receives sensor data (e.g., spectral data, chamber data, etc.) associated with a current substrate (e.g., real-time in-situ data) processed according to a current process in a processing chamber at manufacturing system 200. In some embodiments, processing logic can receive the current spectral data from chamber status equipment 124 or other sensors disposed within or coupled to a process chamber performing the current process, as previously described. In some embodiments, processing logic can receive the current sensor data at particular time periods of the current process. For example, chamber status equipment 124 can be configured to collect sensor data for the current substrate at particular intervals (e.g., once every second) during the substrate process. Chamber status equipment 124 can collect the sensor data at a respective interval of the substrate process and transmit the spectral data to server machine 320, where it is received by processing logic of chamber condition engine 330.

At block 712, processing logic generates normalized sensor data (e.g., data pre-process) that includes an indication of a spectral feature. Processing logic may perform functions and/or methodology to extract feature and/or generate synthetic/engineered data associated with the received sensor data. For example, processing logic may perform a feature extraction of the spectral data to identify spectral features. In another example, processing logic may perform a feature extraction using combinations of spectral data to determine whether a criterion is satisfied. In some embodiments, processing logic can perform principal component analysis (PCA) to select the most important features of the spectral data. A principal component analysis refers to an analysis of a collection of points in a real coordinate space to perform a change of basis on the collection of points. In some embodiments, the set of spectral features includes a range of wavelengths of the detected light that correspond with the individual chamber condition metrics. In such embodiments, processing logic can identify the particular wavelengths based on analyzing the spectral data. For example, processing logic can provide data associated with a structure of the substrate (e.g., CD, thickness, material property, SWA, etc.) as input to a wave analysis model and extract one or more outputs. Processing logic can determine, based on the one or more outputs that a particular range of the light spectrum correspond to the particular type of metrology measurement and that wavelengths X and Y are included in the particular range. In additional or alternative embodiments, the outputs of the wave analysis model can indicate that wavelengths X and Y correspond to the particular type of metrology measurement. In response to identifying the particular wavelengths that correspond to the particular type of metrology measurement, processing logic can extract a set of spectral data that corresponds to wavelengths X and Y from the normalized spectral data.

In some embodiments, the set of spectral features includes spectral trends or patterns that are present in spectral data for one or more wavelengths that correspond with the particular type of metrology measurement corresponding to particular chamber conditions. Processing logic can perform one or more analysis operations (e.g., rigorous coupled wave analysis (RCWA)) for normalized spectral data for the one or more wavelengths to identify spectral trends or patterns that correspond with the particular type of metrology measurement value corresponding to a chamber condition. In some embodiments, processing logic can identify a portion of the normalized spectral data for a particular wavelength that is associated with the particular type of metrology measurement. For example, processing logic can identify that the normalized spectral data for wavelength Y between an initial time period and a first intermediate time period is associated with a critical dimension measurement. A normalization may include processing the incoming sensor data (e.g., spectral data and/or chamber data) to appear similar across the various chambers and sensors used to acquire the data.

At block 714, processing logic determines if there is an anomaly in the received in-situ data collected in association with a substrate process. An anomaly may include identifying one or more datapoints having a combination of values (e.g., a spectral value, a chamber parameter value, etc.) that don't correlate with historical combinations of the association value. Processing logic may determine that the received data meets a threshold condition (e.g., threshold specification). A threshold condition may include the data matching (e.g., correlating) with historical data (e.g., having a threshold condition above a correlation coefficient). Processing logic may determine the absence of a processing anomaly and proceeds along the no path to block 720 and continue to process the received data further. Processing logic may determine the presence of an anomaly within the received data sets, and proceed along the yes branch to block 716.

In some embodiments, processing logic inputs the received data (e.g., sensor data, spectral data, chamber data) into a model (e.g., a statistical model). Processing logic receives one or more outputs from the model. The one or more outputs may indicate a level of confidence that temporally associated data points of the chamber data, spectral data, and/or process result data accurately indicate conditions of the processing chamber. The statistical model may be generated using a regression between historical chamber data, historical spectral data, and/or historical process result data. Processing logic may determine that the level of confidence meets a threshold decisions to determine the presence or absence of an anomaly within the received data.

In some embodiments the statistical model is generated using statistical process control (SPC) analysis to determine control limits for the received data and identify data as being more or less dependable based on those control limits. In some embodiments, the statistical model is associated with univariate and/or multivariate data analysis (e.g., of the historical data). For example, various parameters can be analyzed using the statistical model to determine patterns and correlations through statistical processes (e.g., range, minimum, maximum, quartiles, variance, standard deviation, and so on). In another example, relationships between multiple variables (e.g., chamber data and spectral data) can be ascertained using regression analysis, path analysis, factor analysis, multivariate statistical process control (MCSPC) and/or multivariate analysis of variance (MANOVA).

In some embodiments, processing logic determines data based on whether a substrate criterion is satisfied. A substrate criterion may include one or more of film thickness requirements, process uniformity requirements, critical dimension specification, SWA specification, etc.) In some embodiments, processing logic can determine that a substrate criterion is satisfied by determining that the received spectral data corresponds to spectral data associated with a particular type of substrate process and/or the particular type of substrate. For example, processing logic can retrieve (e.g., from data store 150) spectral data that was previously collected for a particular type of substrate that was processed according to a particular type of process. The previously collected spectral data can include one or more spectral data features (e.g., a spectral signature) that are specific to the type of substrate and/or the type of process, or a particular step or time period of the type of process. Processing logic can determine whether the received spectral data for the current substrate includes one or more spectral data features that correspond to (i.e., approximately equal) the respective spectral data features that are included in the previously collected spectral data.

At block 716, corrective action is performed. In some embodiments, chamber examination is carried out to identify one or more deficiencies of the manufacturing equipment and determines a corrective action to remedy the deficiency. Processing logic may cause a notification to be displayed on a GUI indicating an error, a data anomaly, and/or a corrective action to be taken, etc. In some embodiments, processing logic initiates the creation, training, validation, and/or selection of one or more new models to perform the actions described herein. In some embodiments, processing logic may update the currently used model to correct for the detected anomalies. For example a user may load an old model that specifies the type of mode, the settings/parameters, and old data used to create the model. Processing logic may use the old model as a starting place (e.g., initial guess) for training an updated model. Additional data may be added to the system and used to further train and/or validate the model to generate an updated model. Processing logic proceed with updating new data and further evaluating the system after performing the corrective action with the new data.

At block 720, processing logic provides the sensor data to be used as input to a trained machine learning model. In some embodiments, processing logic can provide the spectral data to predictive engine 328, which can cause predictive engine 328 to perform one or more operations of method 800 described with respect to FIG. 8.

At block 722, processing logic obtains a chamber condition metric extracted from one or more outputs of the trained machine learning model. In some embodiments, processing logic can receive an indication of the chamber condition metric from predictive engine 328, obtained in accordance with method 800. At block 724, processing logic determines whether a chamber condition metric criterion is satisfied. In some embodiments, processing logic can determine whether the chamber condition metric criterion is satisfied by determining whether the substrate processed within the chamber under the current chamber conditions meets a process result criterion associated with the current process. The extracted chamber condition metric can correspond to a recovery status of a processing chamber associated with a recovery process (e.g., chamber seasoning) subsequent to a PM procedure.

In response to processing logic determining the chamber condition metric criterion is satisfied, method 700 proceeds to block 728. At block 728, processing logic continues the current process for the current substrate. In some embodiments, processing logic can continue the current process by transmitting an instruction to system controller 228 or the local controller for the process chamber to continue the current process. In other or similar embodiments, processing logic can continue the current process by generating and transmitting no instruction(s). Processing logic can transmit the sensor data (e.g., spectral data, chamber data) and the extracted metrology measurement value to training set generator 324 to be used as additional training data, as described above.

In response to processing logic determining that the chamber condition metric criterion is not satisfied, method 700 proceeds to block 726. At block 726, processing logic generates an instruction to alter a performance of the manufacturing equipment. In some embodiments processing logic transmits an instruction to terminate the current process at the manufacturing system. In some embodiments, processing logic can transmit the instruction to the system controller (e.g., system controller 228), which causes the system controller to terminate the current process. In other or similar embodiments, processing logic can transmit the instruction to a local processing device for the process chamber, which causes the process chamber to terminate the current process. In additional or alternative embodiments, processing logic can transmit the spectral data and the extracted metrology measurement value to training set generator 324 (i.e., at server machine 320 or at server machine 350) to be used as additional training data. In some embodiments, processing logic transmits an instruction to update one or more process parameters associated with the manufacturing equipment. The instruction may further include a command to further process the current substrate according to the updated process parameters.

Referring back to block 724, in some embodiments, processing logic can further determine whether the chamber condition metric criterion is satisfied by determining whether the chamber condition metric falls within a range of expected chamber condition metric values associated with the time period for the current process. The range of expected chamber condition metrics can include a set of values that are expected to be associated with the current substrate at the current time period of the current process. In some embodiments, processing logic can determine, in view of the extracted chamber condition metric value(s), that an accuracy of the trained machine learning model no longer satisfies an accuracy criterion (i.e., an overall accuracy of the trained machine learning model falls below a threshold overall accuracy). Inline or integrated metrology data can be employed to verify the accuracy of the trained machine learning model. For example, the model may output that the chamber is operating under normal operating condition however the metrology data associated with the substrate processed under the supposed normal operating conditions may fail to meet process result requirements (e.g., thickness requirements, critical dimension requirements, SWA requirements, etc.) Accordingly, processing logic can transmit a notification to the client device indicating that the machine learning model is to be retrained. In some embodiments, processing logic can transmit a notification to training set generator 324 and/or training engine 326 to re-train the machine learning model, in accordance with embodiments described herein.

At block 730, processing logic proceeds to the next iteration of measurements. Processing logic performs method 700 using data associated with further processing a current substrate and/or processing the next substrate and/or using the next process recipe.

Figure 8:
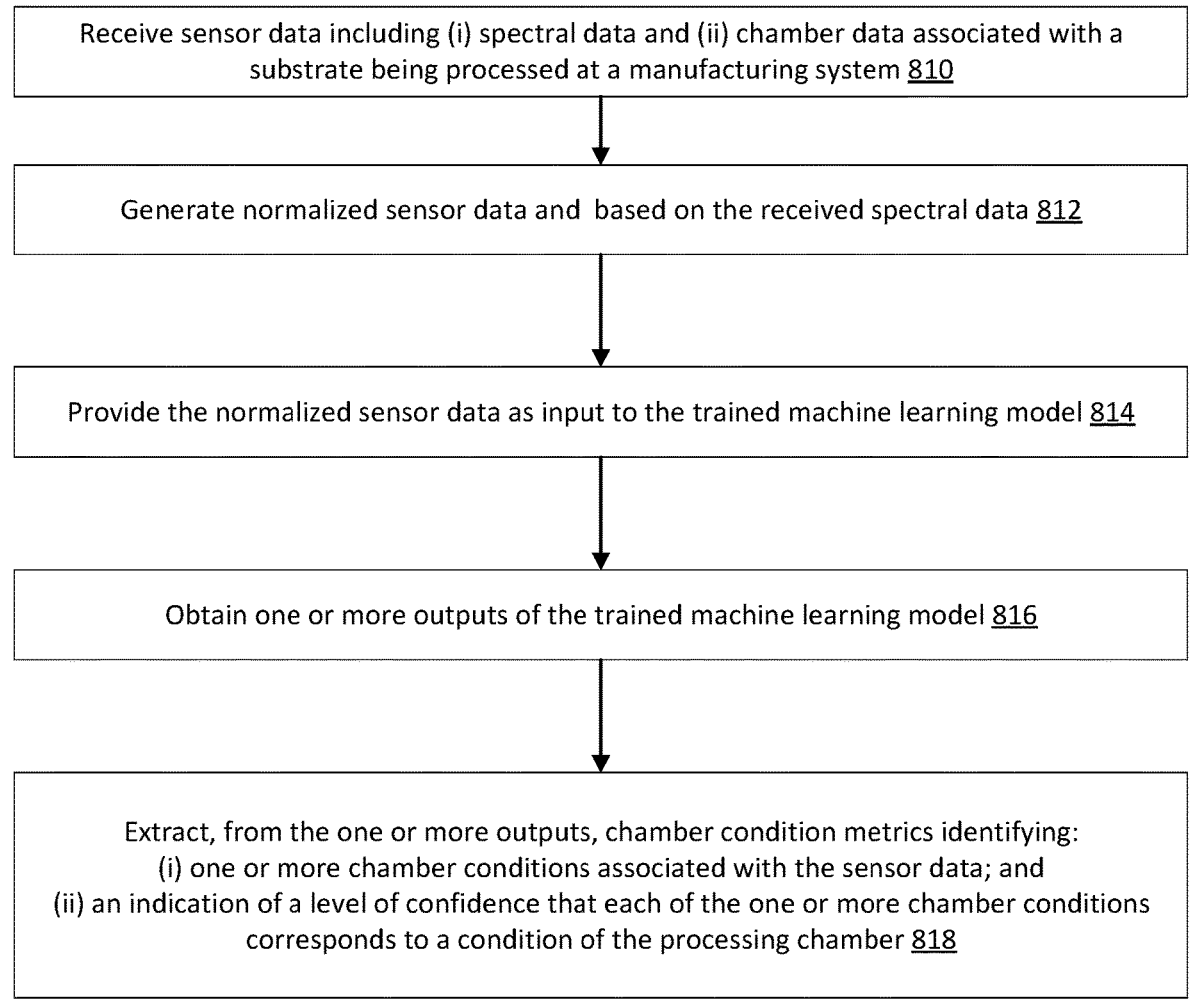
FIG. 8 is a flow chart of a method for predicting chamber conditions of a processing chamber processing a current substrate using a machine learning model, according to aspects of the present disclosure.

FIG. 8 is a flow chart of a method 800 for predicting chamber conditions of a processing chamber processing a current chamber using a machine learning model, according to aspects of the present disclosure. Method 800 is performed by processing logic that can include hardware (circuitry, dedicated logic, etc.), software (such as is run on a general purpose computer system or a dedicated machine), firmware, or some combination thereof. In one implementation, method 800 can be performed by a computer system, such as system architecture 100 of FIG. 1. In other or similar implementations, one or more operations of method 800 can be performed by one or more other machines not depicted in the figures. In some aspects, one or more operations of method 800 can be performed by predictive engine 328 of server machine 320 described with respect to FIG. 3.

At block 810, processing logic receives spectral data and chamber data associated with a processing chamber processing a substrate. In some embodiments, the spectral data can include optical emission spectra (OES) measurements of a plasma disposed within the processing chamber. In some embodiments, the spectral data can include optical reflectance spectra measurements corresponding to a reflectance pattern of light reflected off a surface of the substrate disposed within the processing chamber. In some embodiments the spectra and chamber data can be received from chamber status equipment, such as chamber status equipment 124, or other sensors disposed within or coupled to the process chamber, in accordance with previously described embodiments.

At block 812, processing logic generates normalized sensor data that includes an indication of a spectral feature. Processing logic may perform functions and/or methodology to extract feature and/or generate synthetic/engineered data associated with the received sensor data. For example, processing logic may perform a feature extraction of the spectral data to identify spectral features. In another example, processing logic may perform a feature extraction using combinations of spectral data to determine whether a criterion is satisfied. Processing logic can analyze multiple data point of an associated parameter to determine whether rapid changes occurred during a portion of a substrate process. In some embodiments, processing logic perform a normalization across the various sensor data (e.g., spectral data and/or chamber data) associated with various process chamber conditions. A normalization may include processing the incoming sensor data (e.g., spectral data and/or chamber data) to appear similar across the various chambers and sensors used to acquire the data.

At block 814, processing logic provides the normalized sensor data as input to the trained machine learning model. In some embodiments, the trained machine learning model can correspond to machine learning model 334, described with respect to FIG. 3. In some embodiments, training engine 326 selects machine learning model 334 for use by predictive engine 328, in accordance with embodiments described with respect to FIG. 9 below. At block 816, processing logic obtains one or more outputs of the machine learning model. At block 818, processing logic extracts, from the one or more outputs, chamber condition metrics identifying: (i) one or more chamber conditions associated with the sensor data, and (2) an indication of a level of confidence that each of the one or more chamber conditions corresponds to a condition of the processing chamber. In one example, the level of confidence is a real number between 0 and 1 inclusive. It should be noted that, in some embodiments, the level of confidence does not correspond to a probability. For example, the sum of the confidence levels for all chamber condition metrics may not equal 1.

In some embodiments, processing logic can use the chamber condition metrics to determine a recovery status of a processing chamber corresponding to a recovery procedure performed subsequent to a preventative maintenance (PM) procedure being performed. In some embodiments, if the level of confidence for the chamber condition metrics satisfy a threshold condition, then a processing condition of the processing chamber is identified as being associated with the chamber condition metrics. Processing logic can determine that the level of confidence for the metrology measurement value satisfies the threshold condition in response to determining that the level of confidence exceeds a threshold level of confidence. Processing logic can provide the chamber condition metrics to chamber condition engine 330, in accordance with embodiments described with respect to FIG. 10.

Figure 9:
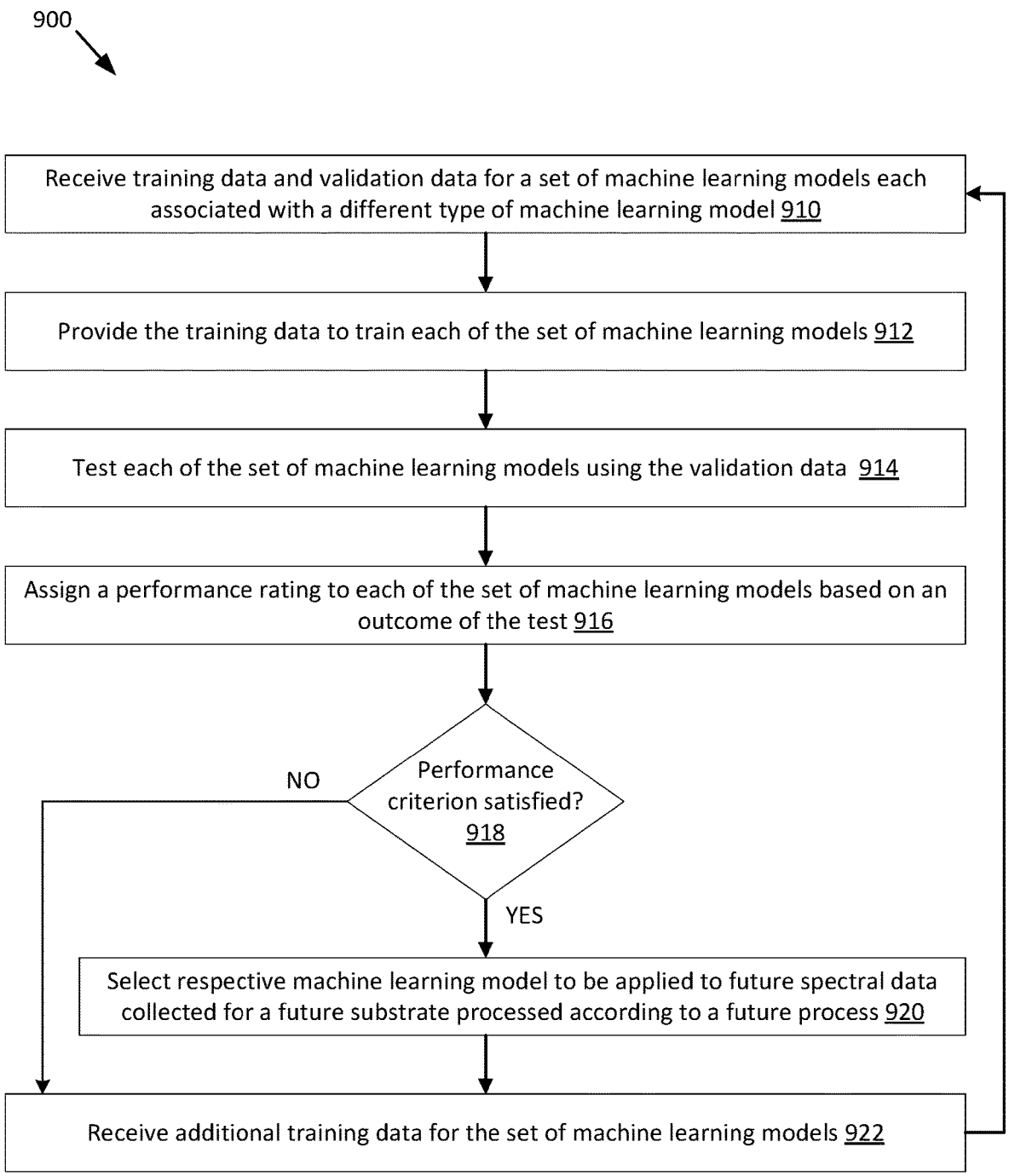
FIG. 9 is a flow chart of a method for selecting a machine learning model for estimating a type of metrology measurement value, according to aspects of the present disclosure.

FIG. 9 is a flow chart of a method 900 for selecting a machine learning model for estimating a type of metrology measurement value, according to aspects of the present disclosure. Method 900 is performed by processing logic that can include hardware (circuitry, dedicated logic, etc.), software (such as is run on a general purpose computer system or a dedicated machine), firmware, or some combination thereof. In one implementation, method 900 can be performed by a computer system, such as system architecture 100 of FIG. 1. In other or similar implementations, one or more operations of method 900 can be performed by one or more other machines not depicted in the figures. In some aspects, one or more operations of method 900 can be performed by training engine 326 of server machines 320 or 350, described with respect to FIG. 3.

At block 910, processing logic receives training data and/or validation data for a set of machine learning models. Each of the set of machine learning models can correspond to a different machine learning model type. For example, each of the set of machine learning models can correspond to a linear regression model, a partial least squares regression model, a Gaussian regression model, a random forest model, a support vector machine model, a neural network, a ridge regression model, and so forth. In some embodiments, processing logic can receive training data and the validation data from training set generator 324 of server machines 320 or 350. Training set generator 324 can generate training data in accordance with embodiments described with respect to method 400 of FIG. 4. In other or similar embodiments, processing logic can receive the training data from training set generator 324 and can generate the validation data based on the received training data. Training data can correspond to training set 340 and validation data can correspond to data included in validation set 342, described with respect to FIG. 3.

At block 912, processing logic trains each of the set of machine learning models using the received training data. At block 914, processing logic performs one or more testing operations for each of the set of machine learning models using the validation data. As described above, validation set 342 can include sensor data (e.g., chamber data and spectral data) and chamber conditions corresponding to metrology data for a processing chamber processing a prior substrate that is different from sensor data (e.g., spectral data and chamber data) and chamber condition corresponding to metrology data included the training data. To perform the one or more testing operations, processing logic can provide the sensor data of validation set 342 as input to each of the set of trained machine learning models and can obtain one or more outputs of each of the trained models. Processing logic can extract a chamber condition metric from the obtained one or more outputs, in accordance with embodiments provided herein.

In some embodiments the trained machine learning model is to receive a new input having new sensor data having new chamber data indicating a new state of a new environment of a new processing chamber processing a new substrate according to a new process and new spectral data indicating optical emission spectra (OES) measurements of a new plasma disposed within the new processing chamber processing the new substrate according to the new process to produce a new output based on the new input. The new output indicates a chamber condition metric corresponding to a recovery status associated with a chamber recovery process performed subsequent to a preventative maintenance procedure.

At block 916, processing logic assigns a performance rating to each of the set of machine learning models based on an outcome of the one or more testing operations performed with respect to block 914. In some embodiments, processing logic can assign a performance rating to a respective machine learning model based on an accuracy score determined for the machine learning model. Processing logic can determine an accuracy score based on a difference between a chamber condition metric extracted from output(s) of the respective machine learning model and an actual chamber condition for a processing chamber. For example, as described with respect to block 914, processing logic can provide sensor data from validation set 342 as input to a respective machine learning model and can extract a chamber condition metric from an output of the model. Processing logic can compare the extracted chamber condition metric with an actual chamber condition (e.g., by comparing metrology results of wafer processing under both conditions) with the provided sensor data of the validation set 342. Processing logic can assign an accuracy score to the model based on the difference between the extracted value and the actual value of validation set 342. For example, processing logic can assign a high accuracy score to a respective model if the difference between the extracted value produced by the model and the actual value is small. Similarly, processing logic can assign a low accuracy score to the respective model if the difference is large.

In additional or alternative embodiments, processing logic can further assign the performance rating to the respective machine learning model based on a speed score determined for the machine learning model. In some embodiments, processing logic can determine the speed score based on an amount of time after the processing logic provides the sensor data as input to the model that the one or more outputs of the model are obtained. In other or similar embodiments, processing logic can determine the speed score based on the amount of time after the processing logic provides the spectral data as input to the model that the processing logic extracts the metrology measurement value from the one or more obtained outputs. In one example, the processing logic can assign a high speed score to a respective model if the amount of time after the processing logic provides the sensor data as input to the model that the model provides the one or more outputs (or the processing logic extracts the metrology measurement value) is small.

In some embodiments, processing logic can assign the performance rating to the respective machine learning model based on an efficiency score determined for the machine learning model. As described with respect to FIG. 3, in some embodiments, training engine 356 can be included at server machine 350, which is separate from server machine 320. In such embodiments, training engine 356 can train each of the set of the machine learning models at server machine 350. Training engine 356 can perform the one or more testing operations described with respect to block 914 to determine which of the set of machine learning models are to be transmitted to server machine 320 for use by predictive engine 328. Processing logic can determine the efficiency score for a respective machine learning model based on an overall system efficiency (e.g., for the manufacturing system) with respect to transmitting the respective machine learning model from server machine 350 to server machine 320 and/or initializing the respective machine learning model at server machine 320. In some embodiments, processing logic can determine the efficiency score based on an amount of memory used to store the respective trained machine learning model, the amount of memory available at data store 332 of server machine 320, the amount of network bandwidth available to transmit the respective trained machine learning model to server machine 320, and so forth.

At block 918, processing logic determines whether a performance criterion is satisfied based on the assigned performance rating for each of machine learning models. In some embodiments, processing logic can determine whether the performance criterion is satisfied by determining whether the assigned performance rating (i.e., determined based on the accuracy score and, in some embodiments, the speed score and/or the efficiency score) for a respective machine learning model exceeds a threshold performance score. In other or similar embodiments, processing logic can determine whether the performance criterion is satisfied by determining whether the accuracy score for the respective model exceeds a threshold score and whether the overall performance rating (i.e., determined based on the accuracy score and the speed score and/or the efficiency score) for the respective model exceeds a threshold performance score. In some embodiments, more than one trained machine learning model can be associated with an accuracy score and/or a performance rating that satisfies a threshold score and/or threshold rating, respectively. In such embodiments, processing logic can determine that the respective model of the more than one trained models that is associated with the highest accuracy score and/or performance rating that satisfies the performance criterion. In some embodiments, processing logic can determine that no trained machine learning models of the set of machine learning models are associated with an accuracy score and/or performance rating that satisfies the threshold score and/or threshold rating, respectively. In such embodiments, processing logic can determine that no model satisfies the performance criterion.

In response to determining that the performance criterion is satisfied, processing logic proceeds to block 920. At block 920, processing logic selects a respective machine learning model to be applied to future sensor data collected for future substrates processed according to a future substrate process. As described above, in some embodiments, training engine 326 can be included with predictive engine 328 at server machine 320. In such embodiments, in response to selecting the respective machine learning model to be applied to future spectral data, processing logic can store the respective model and/or an indication that the respective model is to be used by predictive engine 328 at data store 332. In other embodiments, training engine 326 can be included at server machine 350. In such embodiments, in response to training engine 326 selecting the respective machine learning model to be applied to future sensor data, server machine 350 can transmit the respective machine learning model to server 320 for storage at data store 150.

In response to determining that the performance criterion is not satisfied, processing logic proceeds to block 922. At block 922, processing logic receives additional training data for further training of the set of machine learning models. Processing logic can receive the additional training data from training set generator 324, in accordance with previously described embodiments. In the case of performance criteria is not satisfied, after data is received by block 922, the system may send the data to block 910 and start the flow of method 900 through another iteration.

Figure 10:
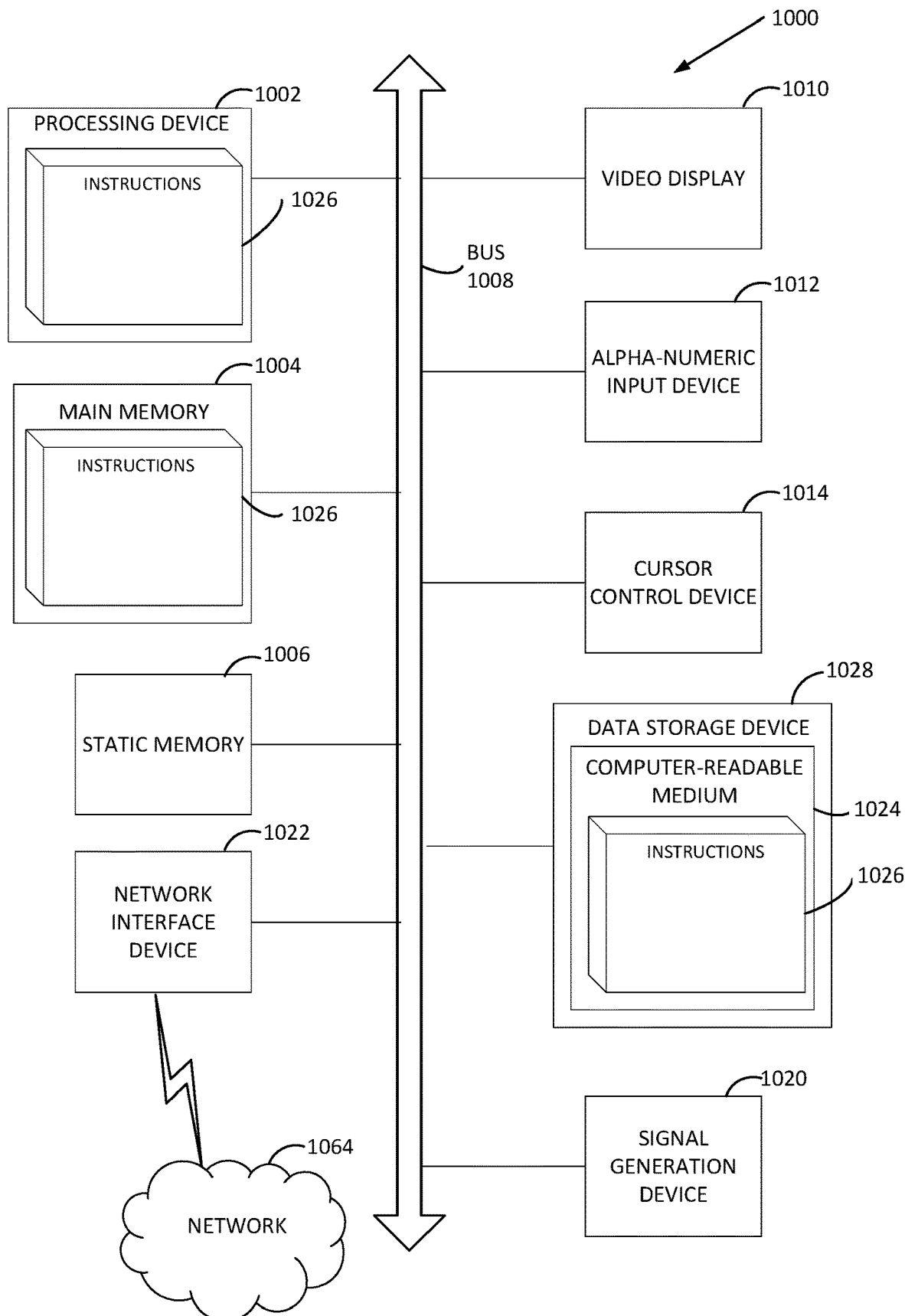
FIG. 10 depicts a diagrammatic representation of a machine in the example form of a computing device within which a set of instructions, for causing the machine to perform any one or more of the methodologies discussed herein, can be executed.

FIG. 10 depicts a diagrammatic representation of a machine in the example form of a computing device 1000 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 1000 can correspond to one or more of server machine 170, server machine 180, predictive server 112, system controller 228, server machine 320, or server machine 350, as described herein.

The example computing device 1000 includes a processing device 1002, a main memory 1004 (e.g., read-only memory (ROM), flash memory, dynamic random access memory (DRAM) such as synchronous DRAM (SDRAM), etc.), a static memory 1006 (e.g., flash memory, static random access memory (SRAM), etc.), and a secondary memory (e.g., a data storage device 1028), which communicate with each other via a bus 1008.

Processing device 1002 can represent one or more general-purpose processors such as a microprocessor, central processing unit, or the like. More particularly, the processing device 1002 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. Processing device 1002 can also be or include a system on a chip (SoC), programmable logic controller (PLC), or other type of processing device. Processing device 1002 is configured to execute the processing logic for performing operations and steps discussed herein.

The computing device 1000 can further include a network interface device 1022 for communicating with a network 1064. The computing device 1000 also can include a video display unit 1010 (e.g., a liquid crystal display (LCD) or a cathode ray tube (CRT)), an alphanumeric input device 1012 (e.g., a keyboard), a cursor control device 1014 (e.g., a mouse), and a signal generation device 1020 (e.g., a speaker).

The data storage device 1028 can include a machine-readable storage medium (or more specifically a non-transitory computer-readable storage medium) 1024 on which is stored one or more sets of instructions 1026 embodying any one or more of the methodologies or functions described herein. Wherein a non-transitory storage medium refers to a storage medium other than a carrier wave. The instructions 1026 can also reside, completely or at least partially, within the main memory 1004 and/or within the processing device 1002 during execution thereof by the computer device 1000, the main memory 1004 and the processing device 1002 also constituting computer-readable storage media.

While the computer-readable storage medium 1024 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
   receiving, by a processing device, sensor data comprising (i) chamber data indicating a state of an environment of a processing chamber processing a substrate according to a set of process parameters of a current process and (ii) spectral data indicating optical emission spectra (OES) measurements of a plasma disposed within the processing chamber processing the substrate according to the set of process parameters of the current process;
   using, by the processing device, the sensor data as input to a machine learning model;
   obtaining, by the processing device, one or more outputs generated by the machine learning model based on the spectral data and the chamber data, the one or more outputs indicating one or more chamber condition metrics wherein the machine learning model is trained to predict the one or more chamber condition metrics based on an association between historical OES measurements of plasma and historical process result data;
   determining, by the processing device, a recovery status of the processing chamber based on the one or more chamber condition metrics, the recovery status corresponding to a chamber recovery process performed subsequent to a preventative maintenance procedure; and
   causing, by the processing device, a modification to a performance of the processing chamber based on (a) determining that a first level of confidence that the sensor data accurately indicates conditions of the processing chamber satisfies a threshold condition, and (b) the recovery status of the processing chamber.

2. The method of claim 1, further comprising:
   determining, by the processing device, an update to at least one process parameter of the set of process parameters to generate an updated set of process parameters based on the one or more chamber condition metrics, wherein the modification to the performance of the processing chamber is further based on the update to the at least one process parameter of the set of process parameters.

3. The method of claim 2, wherein causing the modification to the performance of the processing chamber further comprises sending a first command that causes at least one of:
   the substrate or a new substrate to be processed according to the updated set of process parameters; or
   substrate processing within the processing chamber to halt.

4. The method of claim 1, further comprising causing a notification to be displayed on a graphical user interface (GUI), the notification indicating the modification to the performance of the processing chamber.

5. The method of claim 1, wherein the modification to the performance corresponds to a chamber seasoning procedure.

6. The method of claim 1, wherein the spectral data further comprises:
   optical reflectance spectra measurements corresponding to a reflectance pattern of light reflected off a surface of the substrate disposed within the processing chamber.

7. The method of claim 6, further comprising:
   determining one or more spectral features based on combinations of the OES measurements and the optical reflectance spectra measurements to generate feature data; and
   using the feature data as input to the machine learning model.

8. The method of claim 1, wherein determining that the first level of confidence that the sensor data accurately indicates conditions of the processing chamber satisfies the threshold condition comprises:
   using the sensor data as input to a statistical model;
   receiving one or more outputs from the statistical model, the one or more outputs indicating a second level of confidence that temporally associated datapoints of the chamber data and the spectral data accurately indicate conditions of the processing chamber, wherein the statistical model is generated using a regression between historical chamber data and historical spectral data; and
   comparing the second level of confidence to one or more threshold conditions, comprising the threshold condition.

9. The method of claim 1, wherein receiving the sensor data and causing the modification to the performance of the processing chamber both occur while the processing chamber is processing the substrate according to the set of process parameters.

10. A non-transitory computer readable medium comprising instructions that, when executed by a processing device, cause the processing device to:
    receive sensor data comprising (i) chamber data indicating a state of an environment of a processing chamber processing a substrate according to a set of process parameters of a current process and (ii) spectral data indicating optical emission spectra (OES) measurements of a plasma disposed within the processing chamber processing the substrate according to the set of process parameters of the current process;
use the sensor data as input to a machine learning model;
obtain one or more outputs generated by the machine learning model based on the
determine a recovery status spectral data and the chamber data, the one or more outputs indicating one or more chamber condition metrics, wherein the machine learning model is trained to predict one or more chamber condition metrics based on an association between historical OES measurements of plasma and historical process result data; of the processing chamber based on the one or more chamber condition metrics, the recovery status corresponding to a chamber recovery process performed subsequent to a preventative maintenance procedure; and
cause a modification to a performance of the processing chamber based on (a) determining that a level of confidence that the sensor data accurately indicates conditions of the processing chamber satisfies a threshold condition, and (b) the recovery status of the processing chamber.

11. The non-transitory computer readable medium of claim 10, wherein the instructions, when executed by the processing device further causes the processing device to:
determine an update to at least one of the set of process parameters to generate an updated set of process parameters based on the one or more chamber condition metrics, wherein the modification to the performance of the processing chamber is further based on the update to the at least one of the set of process parameters.

12. The non-transitory computer readable medium of claim 10, wherein the modification to the performance corresponds to a chamber seasoning procedure.

13. The non-transitory computer readable medium of claim 10, wherein determining that the level of confidence that the sensor data accurately indicates conditions of the processing chamber satisfies the threshold conditions comprises:
using the sensor data as input to a statistical model;
receiving one or more outputs from the statistical model, the one or more outputs indicating a level of confidence that temporally associated data points of the chamber data and the spectral data accurately indicate conditions of the processing chamber, wherein the statistical model is generated using a regression between historical chamber data and historical spectral data; and
comparing the level of confidence to one or more threshold conditions, comprising the threshold condition.

* * * * *